US011251156B2

(12) United States Patent
Mueller et al.

(10) Patent No.: US 11,251,156 B2
(45) Date of Patent: Feb. 15, 2022

(54) FABRICATION AND USE OF THROUGH SILICON VIAS ON DOUBLE SIDED INTERCONNECT DEVICE

(71) Applicant: Intel Corporation, Santa Clara, CA (US)

(72) Inventors: Brennen K. Mueller, Hillsboro, OR (US); Patrick Morrow, Portland, OR (US); Kimin Jun, Hillsboro, OR (US); Paul B. Fischer, Portland, OR (US); Daniel Pantuso, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,514

(22) PCT Filed: Dec. 23, 2015

(86) PCT No.: PCT/US2015/000306
§ 371 (c)(1),
(2) Date: May 3, 2018

(87) PCT Pub. No.: WO2017/111792
PCT Pub. Date: Jun. 29, 2017

(65) Prior Publication Data
US 2018/0323174 A1    Nov. 8, 2018

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/486* (2013.01); *H01L 21/76251* (2013.01);
(Continued)

(58) Field of Classification Search
CPC ............... H01L 23/147; H01L 23/473; H01L 23/49827; H01L 23/5385; H01L 23/5389;
(Continued)

(56) References Cited

U.S. PATENT DOCUMENTS

| 4,889,832 A | * | 12/1989 | Chatterjee | ............. H01L 21/743 438/270 |
| 8,674,470 B1 | * | 3/2014 | Or-Bach | ............... H01L 23/485 257/499 |

(Continued)

OTHER PUBLICATIONS

International Preliminary Report on Patentablity for International Patent Application No. PCT/US2015/000306, dated Jul. 5, 2018, 11 pages.
(Continued)

*Primary Examiner* — Ermias T Woldegeorgis
(74) *Attorney, Agent, or Firm* — Schwabe, Williamson & Wyatt, P.C.

(57) ABSTRACT

An apparatus including a circuit structure including a device stratum; one or more electrically conductive interconnect levels on a first side of the device stratum and coupled to ones of the transistor devices; and a substrate including an electrically conductive through silicon via coupled to the one or more electrically conductive interconnect levels so that the one or more inter connect levels are between the through silicon via and the device stratum. A method including forming a plurality of transistor devices on a substrate, the plurality of transistor devices defining a device stratum; forming one or more interconnect levels on a first side of the device stratum; removing a portion of the substrate; and coupling a through silicon via to the one or more interconnect levels such that the one or more interconnect levels is disposed between the device stratum and the through silicon via.

20 Claims, 18 Drawing Sheets

(51) Int. Cl.

| | |
|---|---|
| *H01L 21/768* | (2006.01) |
| *H01L 21/762* | (2006.01) |
| *H01L 21/84* | (2006.01) |
| *H01L 23/485* | (2006.01) |
| *H01L 21/48* | (2006.01) |
| *H01L 23/48* | (2006.01) |
| *H01L 23/498* | (2006.01) |
| *H01L 27/12* | (2006.01) |

(52) U.S. Cl.
CPC .. *H01L 21/76838* (2013.01); *H01L 21/76898* (2013.01); *H01L 21/845* (2013.01); *H01L 23/481* (2013.01); *H01L 23/485* (2013.01); *H01L 23/49827* (2013.01); *H01L 24/05* (2013.01); *H01L 24/08* (2013.01); *H01L 24/09* (2013.01); *H01L 24/16* (2013.01); *H01L 27/1211* (2013.01); H01L 24/06 (2013.01); H01L 24/13 (2013.01); H01L 24/48 (2013.01); H01L 27/1203 (2013.01); H01L 2224/02331 (2013.01); H01L 2224/02381 (2013.01); H01L 2224/0401 (2013.01); H01L 2224/04042 (2013.01); H01L 2224/04105 (2013.01); H01L 2224/05569 (2013.01); H01L 2224/05571 (2013.01); H01L 2224/06181 (2013.01); H01L 2224/06182 (2013.01); H01L 2224/08146 (2013.01); H01L 2224/08235 (2013.01); H01L 2224/09181 (2013.01); H01L 2224/131 (2013.01); H01L 2224/13023 (2013.01); H01L 2224/16141 (2013.01); H01L 2224/16146 (2013.01); H01L 2224/16227 (2013.01); H01L 2224/16235 (2013.01); H01L 2224/17181 (2013.01); H01L 2224/48105 (2013.01); H01L 2224/48228 (2013.01); H01L 2224/48464 (2013.01); H01L 2224/73257 (2013.01); H01L 2225/06513 (2013.01); H01L 2225/06517 (2013.01); H01L 2225/06541 (2013.01); H01L 2225/06548 (2013.01); H01L 2225/06572 (2013.01); H01L 2924/13091 (2013.01)

(58) Field of Classification Search
CPC . H01L 21/6835; H01L 24/80; H01L 25/0652; H01L 25/50; H01L 25/0657; H01L 21/76838; H01L 21/76251; H01L 21/845; H01L 23/485; H01L 21/486; H01L 21/76898; H01L 23/481; H01L 24/09; H01L 27/1211; H01L 24/05; H01L 24/08; H01L 24/16; H01L 24/06; H01L 24/13; H01L 24/03; H01L 24/17; H01L 24/48; H01L 27/1203; H01L 2224/48105; H01L 2224/17181; H01L 2224/48464; H01L 2224/06181; H01L 2224/48228; H01L 2224/73257; H01L 2224/13023; H01L 2224/0401; H01L 2224/04042; H01L 2224/05571; H01L 2224/131; H01L 2224/16227; H01L 2224/02331; H01L 2224/02381; H01L 2224/04105; H01L 2224/05569; H01L 2224/06182; H01L 2224/08235; H01L 2224/09181; H01L 2224/16141; H01L 2224/16235; H01L 2224/08146; H01L 2224/16146; H01L 2224/03462; H01L 2224/80895; H01L 2224/05647; H01L 2224/04; H01L 2224/48091; H01L 2225/06513; H01L 2225/06517; H01L 2225/06541; H01L 2225/06548; H01L 2225/06572; H01L 2924/13091

See application file for complete search history.

(56) References Cited

U.S. PATENT DOCUMENTS

| | | | |
|---|---|---|---|
| 9,385,140 B1* | 7/2016 | McMullan | H01L 23/535 |
| 2010/0117228 A1 | 5/2010 | Yamamichi et al. | |
| 2011/0159638 A1* | 6/2011 | Wang | H01L 21/561 |
| | | | 438/108 |
| 2011/0193235 A1* | 8/2011 | Hu | H01L 23/5389 |
| | | | 257/773 |
| 2012/0074580 A1 | 3/2012 | Nalla et al. | |
| 2012/0112322 A1* | 5/2012 | Lin | H01L 21/76898 |
| | | | 257/618 |
| 2013/0037959 A1* | 2/2013 | Nguyen | H01L 21/6835 |
| | | | 257/774 |
| 2014/0159250 A1 | 6/2014 | Nickerson | |
| 2015/0235922 A1 | 8/2015 | Chen et al. | |
| 2015/0235949 A1 | 8/2015 | Yu et al. | |

OTHER PUBLICATIONS

International Search Report and Written Opinion for International Patent Application No. PCT/US2015/000306 dated Sep. 22, 2016, 14 pgs.

Office Action from Taiwan Patent Application No. 105138463, dated Mar. 23, 2020, 14 pages.

Notice of Allowance from Taiwan Patent Application No. 105138463, dated Jul. 22, 2021, 3 pages.

* cited by examiner

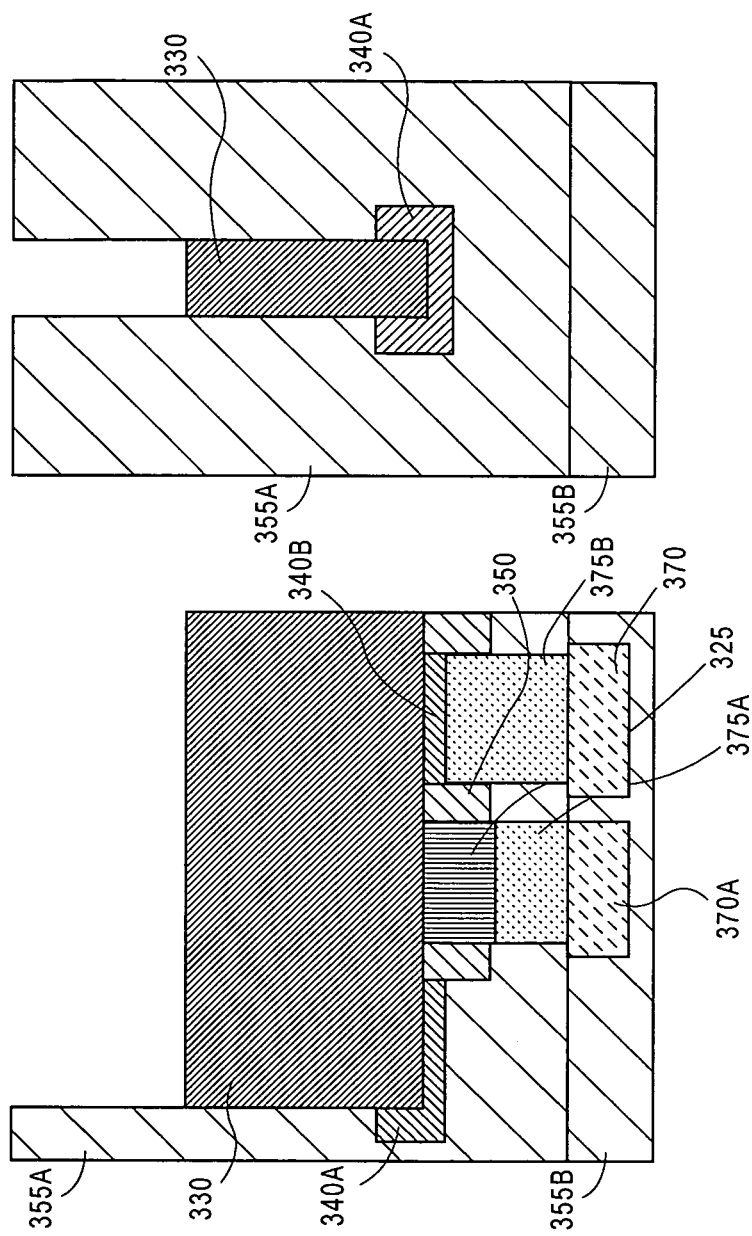

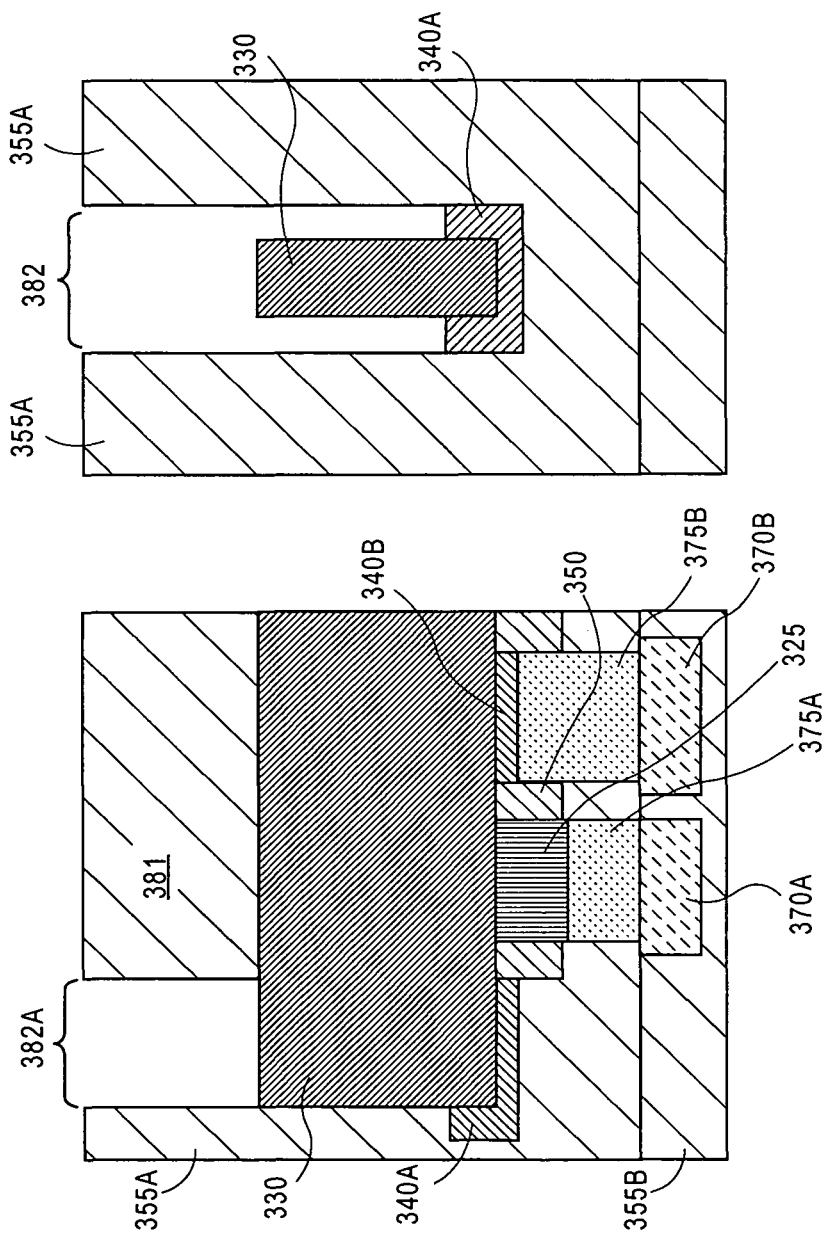

FABRICATION AND USE OF THROUGH SILICON VIAS ON DOUBLE SIDED INTERCONNECT DEVICE

CROSS-REFERENCE TO RELATED APPLICATION

This patent application is a U.S. National Phase Application under 35 U.S.C. § 371 of International Application No. PCT/US2015/000306, filed Dec. 23, 2015, entitled "FABRICATION AND USE OF THROUGH SILICON VIAS ON DOUBLE SIDED INTERCONNECT DEVICE," which designates the United States of America, the entire disclosure of which is hereby incorporated by reference in its entirety and for all purposes.

TECHNICAL FIELD

Semiconductor devices including devices including electrical connections from a backside of the device.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

BRIEF DESCRIPTION OF THE DRAWINGS

FIGS. 7A-7B show cross-sectional side views of the structure of FIG. 6 following the recessing of the fin of a transistor device.

FIGS. 8A-8B shows the structure of FIGS. 7A-7B following the deposition and patterning of a dielectric material on a backside of a fin with a via or opening to a backside of the source of the transistor device.

DETAILED DESCRIPTION

Figure 1:
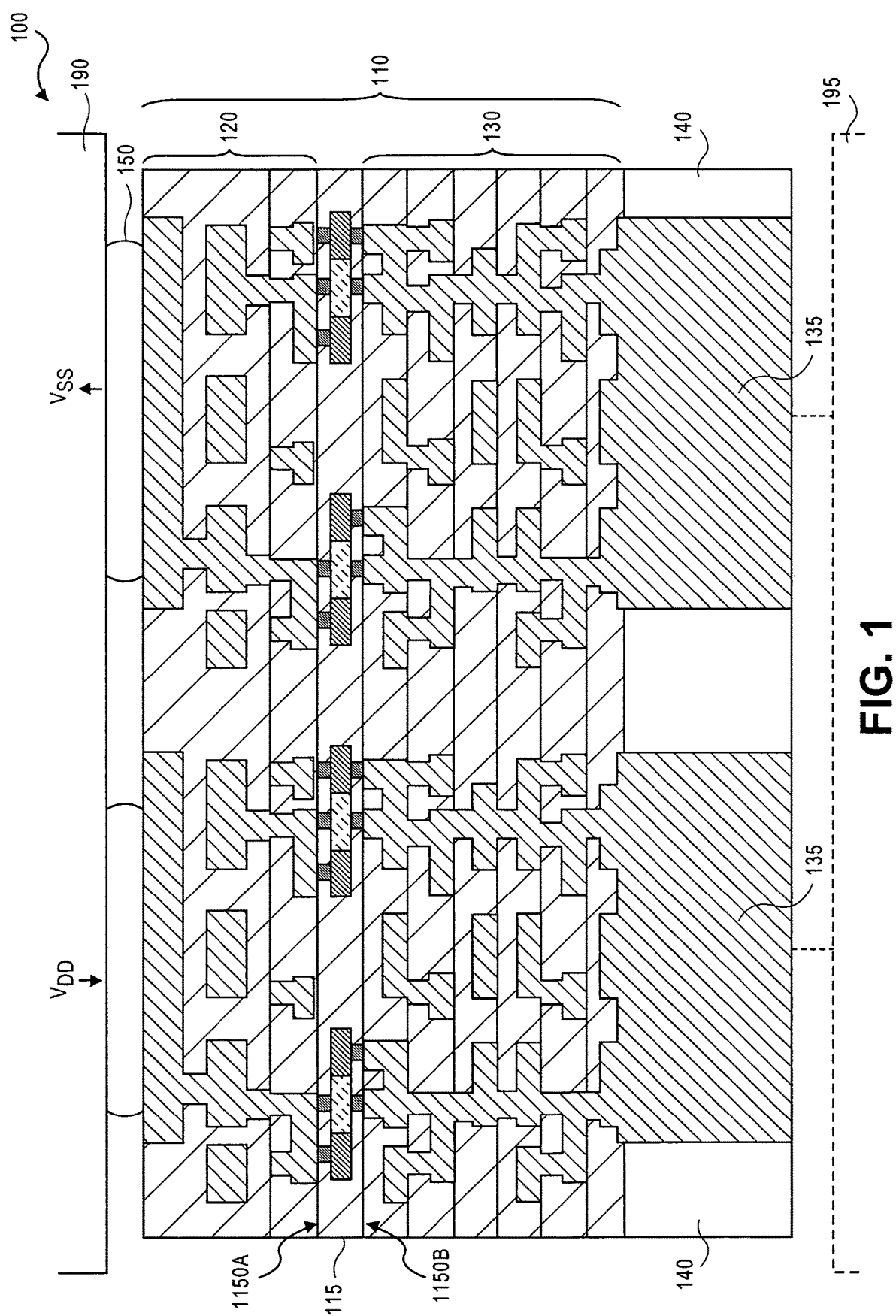
FIG. 1 shows a cross-sectional schematic side view of an embodiment of an assembly including an integrated circuit chip or die connected to a package substrate.

Future circuit devices, such as central processing unit devices, will desire both high performance devices and low capacitance, low power devices integrated in a single die or chip. The embodiments described herein are directed to integrated circuit structures including planar or non-planar semiconductor devices (e.g., three-dimensional devices) in a device stratum with one or more interconnects or wiring layers on each side of the device stratum and one or more through silicon vias (TSVs) landed on one of the wiring layers. In one embodiment, an apparatus including a circuit structure including a device stratum including a plurality of transistor devices each including a first side and an opposite second side; one or more electrically conductive interconnect levels on a first side of the device stratum and connected to ones of the transistor devices; and a substrate including an electrically conductive TSV connected to the one or more electrically conductive interconnect levels on a first side of the structure so that the one or more interconnect levels are between the TSV and the device stratum. In another embodiment, a system is disclosed including a package substrate including a supply connection and a die connected to the package substrate. The die, in one embodiment, includes a device stratum and a substrate including a TSV connected to an interconnect level such that the interconnect level is between the TSV and the device stratum connected to a second side (backside or underside) of a device stratum. A method of forming a circuit structure is also disclosed FIG. 1 shows a cross-sectional schematic side view of one embodiment of an assembly including an integrated circuit chip or die connected to a package substrate. Assembly 100 includes die 110 that includes device layer or stratum 115 including a number of devices (e.g., transistor devices). Device stratum 115 includes first side 1150A representing a first side of the stratum and second side or backside 1150B opposite first side 1150A. The transistor devices include logic circuitry and optionally one or more power transistors. Connected to device stratum 115 of die 110 on first side 1150A are interconnects 120 that, in one embodiment, include, but are not limited to, a number of conductive metal lines connected to devices of device stratum 115 from first side 1150A. Included among the interconnects are control circuitry interconnects and/or power interconnects ($V_{DD}$, $V_{DD}$-gated and $V_{SS}$). Individual rows of metal lines are separated by dielectric material (e.g., interlayer dielectric (ILD)). Electrically connected to devices of device stratum 115 through second side 1150B of device stratum 115, in this embodiment, are interconnects 130. In one embodiment, interconnects 130 include power interconnects and/or control circuitry interconnects in one or more rows of metallization that, at least in some instances, connect with devices of device stratum 115. Individual rows of metal lines are separated by dielectric material (e.g., interlayer dielectric (ILD)). FIG. 1 also shows carrier substrate 140 disposed below interconnects 130 (as viewed). In one embodiment, as will be described below, carrier substrate 140 is bonded to interconnects 130 (more specifically to dielectric material insulating metallization) in a process of forming die 110 with metallization on both sides of the logic circuitry. Disposed through substrate 140 are one or more through silicon vias (TSVs) 135. FIG. 1 shows TSVs 135 connected to interconnects 130 on second side 1150B of device stratum 115. An opposite side of TSVs 135 is available for electrical and physical connection with substrate 195 (e.g., a package or other device) such as through solder connections or metal-to-metal (e.g., copper-to-copper) connections. FIG. 1 also shows ones of interconnects 120 connected to contact points 150 (e.g., solder bumps) that are operable to connect die 110 to substrate 190 such as package 190. FIG. 1 further representatively shows $V_{DD}$ and $V_{SS}$ connections to die 110 through package substrate 190. It is appreciated that contact points 150 are not limited to $V_{DD}$ and $V_{SS}$ connections but may include other connections (e.g., I/O connections).

Figure 2:
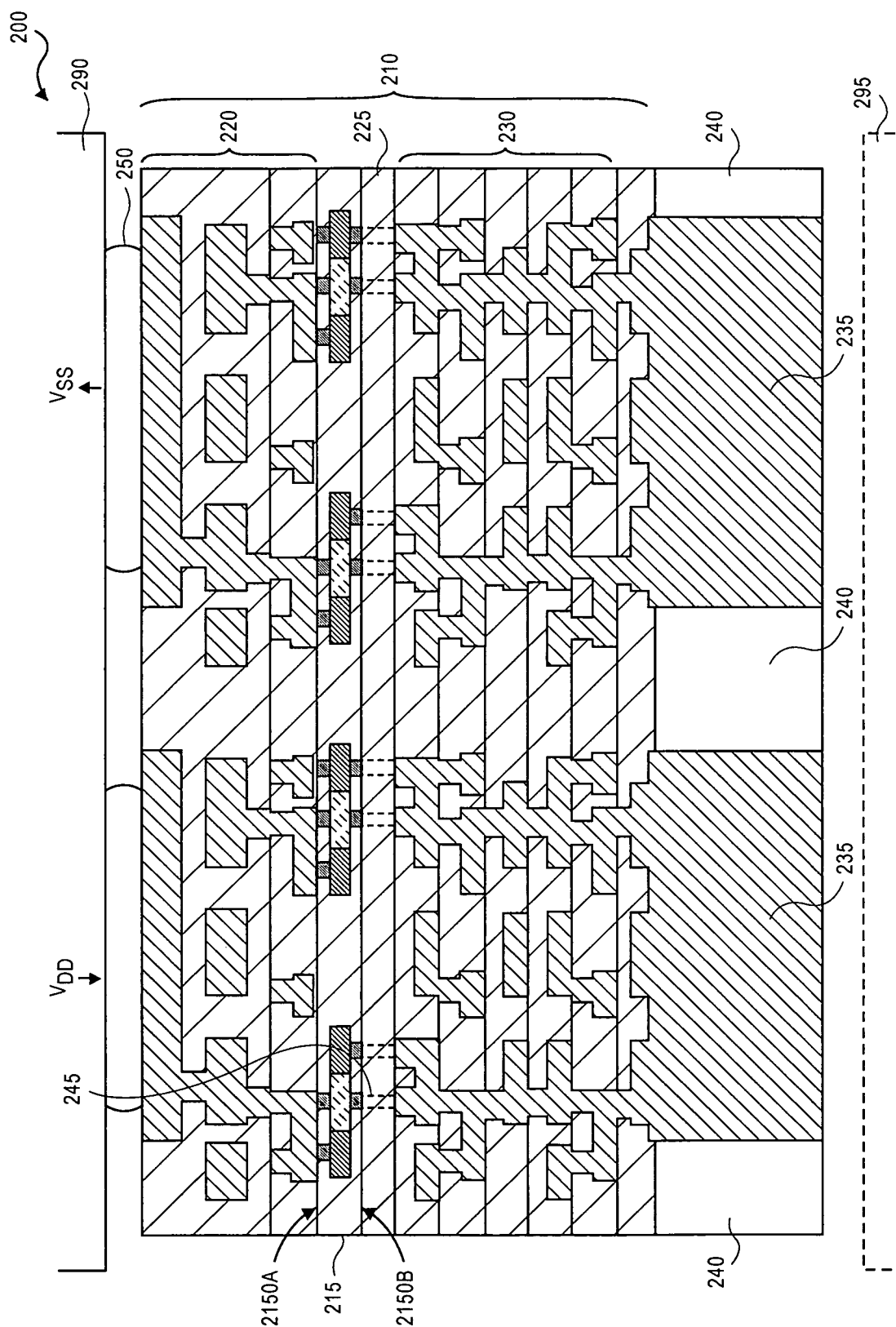
FIG. 2 shows a cross-sectional schematic side view of another embodiment of an assembly including an integrated circuit chip or die connected to a package substrate.

FIG. 2 shows a cross-sectional schematic side view of another embodiment of an assembly including an integrated circuit chip or die connected to a package substrate. Assembly 200 includes die 210 that includes device layer or stratum 215 including a number of devices (e.g., transistor devices). Device stratum 215 includes first side 2150A representing a first side of the stratum and second side or backside 2150B opposite first side 2150A. In this embodiment, second side 2150B of device stratum 215 is connected to substrate 225. Substrate 225 is, for example, a semiconductor material such as silicon, germanium, or another material or materials on which it is suitable to form devices that in one embodiment, is thinned. The transistor devices of device stratum 215 include logic circuitry and optionally one or more power transistors. Other types of transistors or devices may also be optionally included (e.g., embedded memory). Connected to device stratum 215 of die 210 on first side 2150A are interconnects 220 that, in one embodiment, include, but are not limited to, a number of conductive metal lines or metallization connected to devices of devices of device stratum 215 from first side 2150A. Included among the interconnects are control circuitry interconnects and/or power interconnects ($V_{DD}$, $V_{DD}$-gated and $V_{SS}$) Individual rows of metal lines are separated by dielectric material (e.g., interlayer dielectric (ILD)). Connected to ones of devices of device stratum 215 through second side 2150B of the device stratum, in this embodiment, are interconnects 230 that include one or more rows of metal lines. In one embodiment, interconnects 230 include power interconnects and/or logic circuitry interconnects. Interconnects 230 include electrical contacts that are connected to TSVs 245 through substrate 225 that are connected to devices (e.g., a backside of devices) of device stratum 215.

Disposed below interconnects 230 on second side 2150B of device stratum 215, as viewed, is carrier substrate 240. In one embodiment, carrier substrate 240 is bonded to interconnects 230 in a process of forming die 210 with metallization on both sides of the device stratum. Disposed through carrier substrate 240 are one or more TSVs 235. TSVs are connected to interconnects 230 on second side 2150B of device stratum 215. An opposite side of TSVs 235 is available for electrical and physical connection to substrate 295 such as a package or device. FIG. 2 also shows ones of such interconnects 220 on first side 2150A of device stratum 215 are connected to contact points 250 (e.g., solder bumps) that are operable to connect die 210 to package 290. FIG. 2 further representatively shows $V_{DD}$ and $V_{SS}$ connections to die 210 through package substrate 290.

FIGS. 3-13 describe a method or process of forming a die similar to die 110 in FIG. 1 including one or more interconnects on opposite sides of a device stratum, with one or more TSVs landed to one of the one or more interconnects such that the one or more interconnects are between the TSVs and the device stratum. In one embodiment, the devices used in the device stratum are three-dimensional metal oxide semi-conductor field effect transistors (MOSFETs). It is appreciated that in other embodiments, other forms of devices (e.g., planar devices, nanowire devices) are suitable. Good open ended statement.

Figure 3:
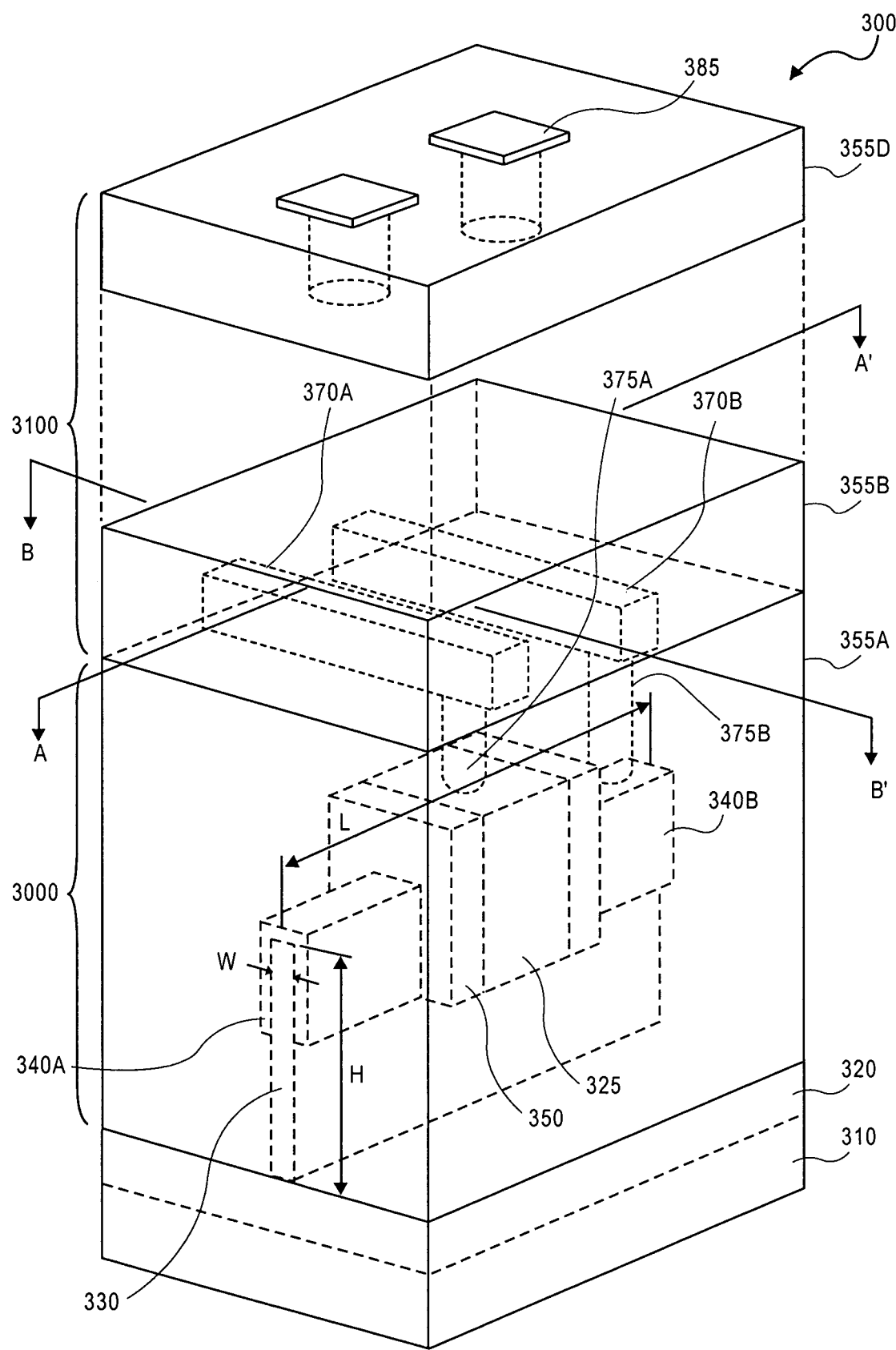
FIG. 3 shows a top side perspective view of a portion of a semiconductor or semiconductor-on-insulator (SOI) substrate that is, for example, a portion of an integrated circuit die or chip on a wafer and illustrates a three-dimensional transistor device formed thereon with an interconnect to the gate electrode and drain of the transistor devices.

FIG. 3 shows a top side perspective view of a portion of a semiconductor or semiconductor-on-insulator (SOI) substrate that is, for example, a portion of an integrated circuit die or chip on a wafer. Specifically, FIG. 3 shows structure 300 including substrate 310 of silicon or SOI. Overlaying substrate 310 is optional buffer layer 320. In one embodiment, buffer layer 310 is a silicon germanium material introduced, in one embodiment, on substrate 310 by a growth technique. Representatively, buffer layer 320, if present, has a representative thickness on the order of a few hundred nanometers (nm).

Disposed on a surface of substrate 310 and optional buffer layer 320 in the embodiment illustrated in FIG. 3 (an upper surface as viewed), is a portion of a transistor device such as an N-type transistor device or a P-type transistor device. Common to an N-type or P-type transistor device, in this embodiment, is body or fin 330 disposed on a surface of buffer layer 320. In one embodiment, fin 330 is formed of a semiconductor material or a stack of more than one semiconductor material such as silicon, silicon germanium or a group III-V or group IV-V semiconductor material. In one embodiment, a material of fin 330 is formed according to conventional processing techniques for forming a three-dimensional integrated circuit device. Representatively, a semiconductor material is epitaxially grown on the substrate and then formed into fin 330 (e.g., by a masking and etch process).

In one embodiment, fin 330 has a length dimension, L, greater than a height dimension, H. A representative length range is on the order of 10 nanometers (nm) to one millimeter (mm), and a representative height range is on the order of 5 nm to 200 nm. Fin 330 also has a width, W, representatively on the order of 4-10 nm. As illustrated, fin 330 is a three-dimensional body extending from or on a surface of substrate 310 (or optionally from or on buffer layer 320). The three-dimensional body as illustrated in FIG. 3 is a rectangular body with opposing sides (first and second sides) projecting from a surface of buffer layer 320 as viewed. It is appreciated that in processing of such bodies, a true rectangular form may not be achievable with available tooling, and other shapes may result. Representative shapes include, but are not limited to, a trapezoidal shape (e.g., base wider than top) and an arch shape.

Disposed on fin 330 in the embodiment of a structure of FIG. 3 is a gate stack. In one embodiment, a gate stack includes a gate dielectric layer of, for example, silicon dioxide or a dielectric material having a dielectric constant greater than silicon dioxide (a high k dielectric material). Disposed on the gate dielectric layer, in one embodiment, is gate 325 of, for example, a metal. The gate stack may include spacers 350 of dielectric material on opposite sides thereof. A representative material for spacers 350 is a low k material such as silicon nitride (SiN) or silicon carbon nitrogen (SiCN). FIG. 3 shows optional spacers 350 adjacent the sidewalls of the gate stack and on the fin 330. Formed on or in fin 330 on opposite sides of the gate stack are junctions (source 340A and drain 340B).

In one embodiment, to form the three-dimensional transistor structure, a gate dielectric material is formed on fin 330 such as by way of a blanket deposition followed by a blanket deposition of a sacrificial or dummy gate material. A mask material is introduced over the structure and patterned to protect the gate stack material (gate stack with sacrificial or dummy gate material) over a designated channel region. An etch process is then used to remove the gate stack material in undesired areas and pattern the gate stack over a designated channel region. Spacers 350 are then formed. One technique to form spacers 350 is to deposit a film on the structure, protect the film in a desired area and then etch to pattern the film into desired spacer dimensions.

Following the formation of a gate stack including a sacrificial or dummy gate material on fin 330 and spacers 350, junctions (source and drain) are formed on or in fin 330. The source and drain are formed in or on fin 330 on opposite sides of the gate stack (sacrificial gate electrode on gate dielectric). In the embodiment shown in FIG. 3, source 340A and drain 340B are formed by epitaxially growing source and drain material as a cladding on a portion of fin 330. Representative material for source 340A and drain 340B includes, but is not limited to, silicon, silicon germanium, or a group III-V or group IV-V compound semiconductor material. Source 340A and drain 340B may alternatively be formed by removing portions of the fin material and epitaxially growing source and drain material in designated junction regions where fin material was removed.

Following the formation of source 340A and drain 340B, in one embodiment, the sacrificial or dummy gate is removed and replaced with a gate electrode material. In one embodiment, prior to removal of the sacrificial or dummy gate stack, a dielectric material is deposited on the structure. In one embodiment, the dielectric material is silicon dioxide or a low k dielectric material deposited as a blanket and then polished to expose sacrificial or dummy gate 325. The sacrificial or dummy gate and gate dielectric are then removed by, for example, an etch process.

Following a removal of the sacrificial or dummy gate and gate dielectric, a gate stack is formed in a gate electrode region. A gate stack is introduced, e.g., deposited on the structure, including a gate dielectric and gate electrode. In an embodiment, gate electrode 325 of the gate electrode stack is composed of a metal gate and a gate dielectric layer is composed of a material having a dielectric constant greater than a dielectric constant of silicon dioxide (a high-K material). For example, in one embodiment, the gate dielectric layer (beneath gate electrode 325 in FIG. 3) is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In another embodiment, the gate dielectric layer may include more than one dielectric material, such as silicon dioxide and a high-K material, or two different high-K materials, or other arrangements of dielectric materials. In one embodiment, gate electrode 325 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In another embodiment, the gate electrode may include more than one layer, of suitable metals or other conductive materials. Following the formation of the gate stack, additional dielectric material dielectric material of silicon dioxide or a low k dielectric material is deposited on the three-dimensional transistor device (e.g., on ILD0) to encapsulate or embed the device structure in dielectric material. FIG. 3 shows dielectric Material 355A encapsulating the three-dimensional transistor device (e.g., as an ILD0).

FIG. 3 shows the structure following the forming of interconnects to the three-dimensional transistor device structure. In this embodiment, an electrical connection is made as a first interconnect layer or metal layer to gate electrode 325 and to drain 340B, respectively. A similar technique can be employed to form interconnect to source 340A. Representatively, to form an electrical contact to gate electrode 325, an opening is initially formed from a top surface of dielectric material 355A (as viewed) to the gate electrode by, for example, a masking process with an opening in a mask to gate electrode 325 and drain 340B. Dielectric material 355A is etched to expose the gate electrode and drain and then the masking material removed. Next, a contact material of, for example, tungsten is introduced in the opening and the opening is filled to form contact 375A to gate electrode 325 and contact 375B to drain 340B. A surface of dielectric material 355A (a top surface as viewed) may then be seeded with a conductive seed material and patterned with masking material to define an opening for an interconnect path with the opening exposing contact 375A and contact 375B. A conductive material such as copper is then introduced by way of an electroplating process to form interconnect 370A connected to contact 375A of gate electrode 325 and interconnect 370B connected to contact 375B of drain 340B. Interconnect 370A and interconnect 370B are part of a first interconnect or metal layer or level. The masking material and unwanted seed material can then be removed. Following the formation of interconnects as an initial metal level, dielectric material 355B of for example, silicon dioxide or a low k dielectric material may be deposited as an ILD1 layer on and around the interconnects. Additional interconnect layers may then be formed according to conventional processes. FIG. 1 shows signal wiring 120 of die 110 comprised of multiple layers of interconnect. Interconnect 370A and interconnect 370B in FIG. 3 are representative of one, for example, of a first of such layers nearest the device stratum. An ultimate or top layer as viewed of interconnects includes contact points (e.g., contact pads). FIG. 3 shows ultimate dielectric layer 355D having contacts 385 formed therein and/or thereon. In one embodiment, contacts 385 are connected to one or more underlying interconnect or wiring levels and formed in a manner similar to interconnect 370. For purposes of further discussion, the device stratum of the structure of FIG. 3 is identified by device stratum 3000 and the one or more interconnect levels on a device or first side of device stratum 3000 (a side opposite substrate 310) is identified by interconnects 3100.

Figure 4:
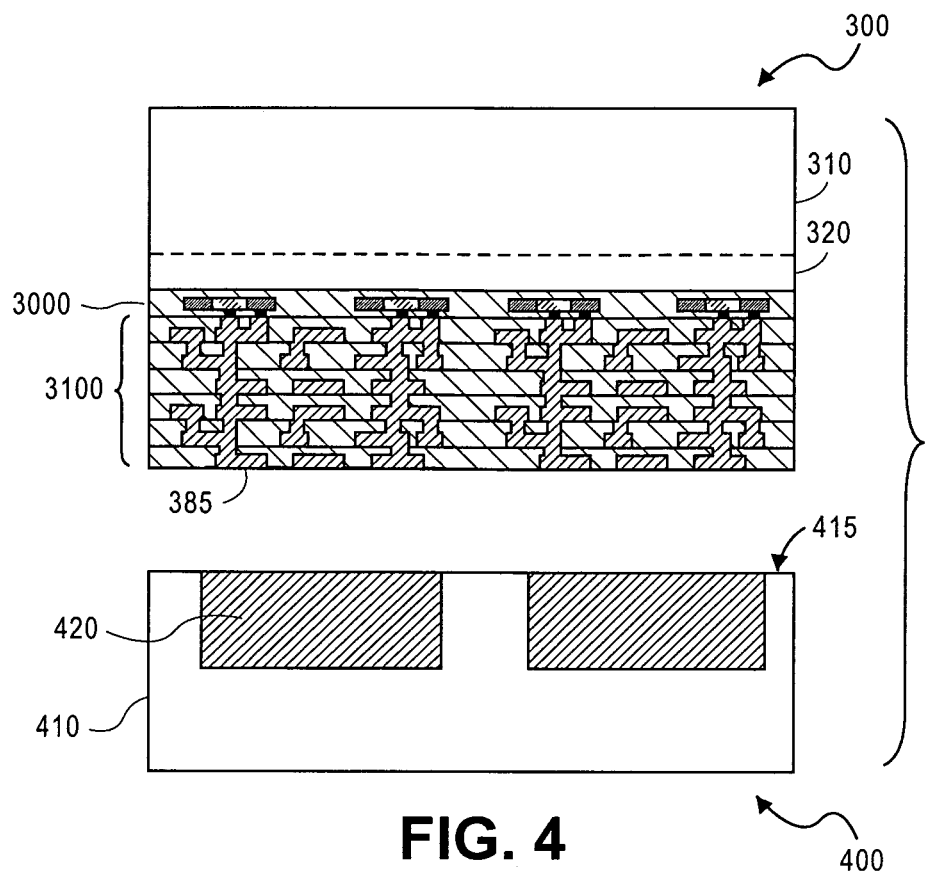
FIG. 4 shows a cross-sectional side view of the device substrate of FIG. 3 inverted and aligned with a carrier substrate.

FIG. 4 shows a cross-sectional side view of an expansive illustration of the structure of FIG. 3 following the inverting or flipping of the structure for connection of the structure to a carrier and aligning the inverted structure with carrier structure 400 below. In this embodiment, the carrier structure is a TSV wafer including substrate 410 that is, for example, a silicon substrate. In this embodiment, substrate 410 includes TSVs 420 of a conductive material (e.g., plated copper) that are only partial TSVs in the sense that they extend from surface 415 of substrate 410 through less than an entire thickness portion of substrate 410 (e.g., halfway through the substrate). Substrate 410 may also include circuit devices formed, for example, on surface 415.

Figure 5:
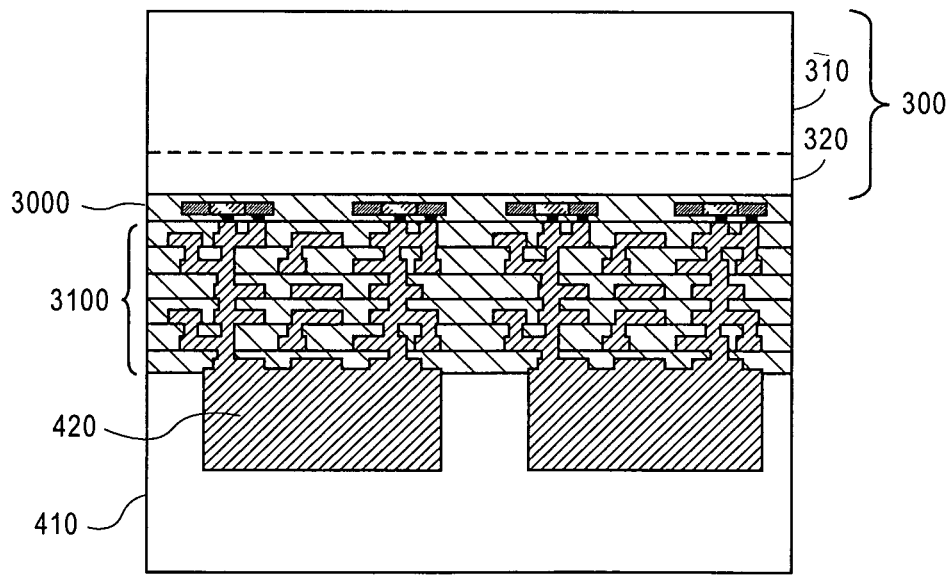
FIG. 5 shows the structure of FIG. 4 following the bonding of the device substrate of FIG. 3 to the carrier substrate.

FIG. 5 shows the assembly of FIG. 4 following the bonding of the carrier structure 400. In one embodiment, the structures are bonded, for example, with an adhesive between the dielectric material on a surface of structure 300 and the semiconductor material of structure 400. FIG. 5 shows TSVs 420 directly connected interconnects 3100 through contact points 385 of structure 300. In an embodiment where there are one or more circuit devices on surface 415 of substrate 410, such devices may also be connected to interconnects 3100 through contact points 385.

Figure 6:
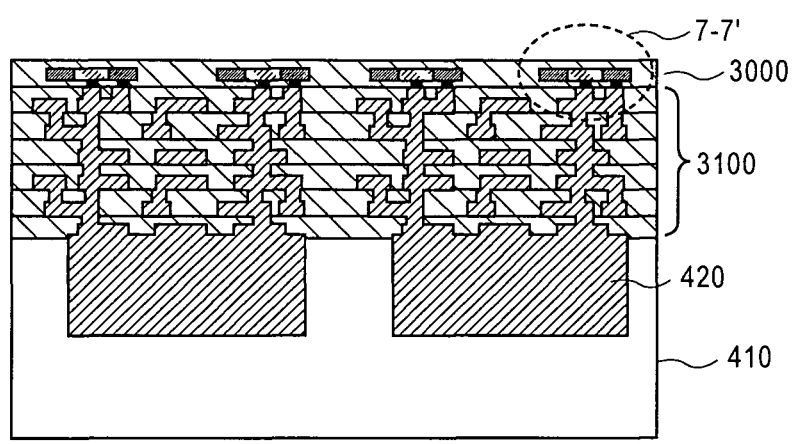
FIG. 6 shows the structure of FIG. 5 following the removal or thinning of the device substrate to expose a second side or backside of a fin of the transistor and following a recessing of the fin.

FIG. 6 shows the structure of FIG. 5 following the removal or thinning of substrate 310 to expose a second side or backside of device stratum 3000 (to expose a backside or underside of fin 330 in FIG. 3). In one embodiment, substrate 310 may be removed by a thinning process, such as a mechanical grinding or etch process. In this embodiment, substrate 310 is completely removed to expose a second side or backside of device stratum 3000. To form a die such as die 210 in FIG. 2, substrate 310 would be thinned but a portion would remain. The thinning of substrate 310 from a second side or backside of the structure may optionally recess or thin a portion of fins of the transistor devices of device stratum 3000 (see FIG. 3).

FIGS. 7A-7B illustrate an embodiment of the formation of a contact to a second side or backside of a transistor device. Specifically identified is the transistor device identified in FIG. 6 by inset reference 7-7'. That transistor device includes contacts to the gate electrode and the drain on a first side or device side of the device stratum similar to the device described with reference to FIG. 3. Using the transistor device of FIG. 3 as a reference, FIG. 7A shows an inverted cross-section through line A-A' of the structure of FIG. 3 and FIG. 7B shows an inverted cross-section through line B-B' of the structure of FIG. 3. FIGS. 7A-7B show the structure following a removal of substrate 310 and an optional recessing of fin 330. In one embodiment, to recess fin 330, an etch process may be utilized with an etchant selective toward a removal of fin material relative to dielectric material 355A. Alternatively, a masking material may be patterned on a surface of dielectric material 355A (an exposed backside surface) with an opening that exposes fin 330. A material of fin 330 may be removed to recess fin 330 by, for example, an etch process, and then the masking material removed.

FIG. 8A and FIG. 8B show the structure of FIG. 7A and FIG. 7B, respectively, following the deposition and patterning of a dielectric material on a backside of fin 330. FIGS. 8A-8B show dielectric material 381 of, for example, a silicon dioxide or a low K dielectric material deposited by for example, a blanket deposition process. Once deposited, dielectric material 381 may be patterned by, for example, forming a masking material on a surface of dielectric material 381 with, in this embodiment, an opening or via opposite, for example, source region on an opposite side of fin 330. FIG. 8A shows opening 382 through dielectric material 381 oriented on a backside of fin 330 corresponding to a source region of the fin (source 340A). FIG. 8B shows that, in this embodiment, the opening (e.g., opening 382) has dimensions for a diameter that is greater than a width dimension of fin 330. In this manner, a backside of fin 330 as well as side walls of fin 330 are exposed. FIG. 8B also shows that the etch proceeds through the structure to expose a backside of source 340A.

Figures 9A, 9B:
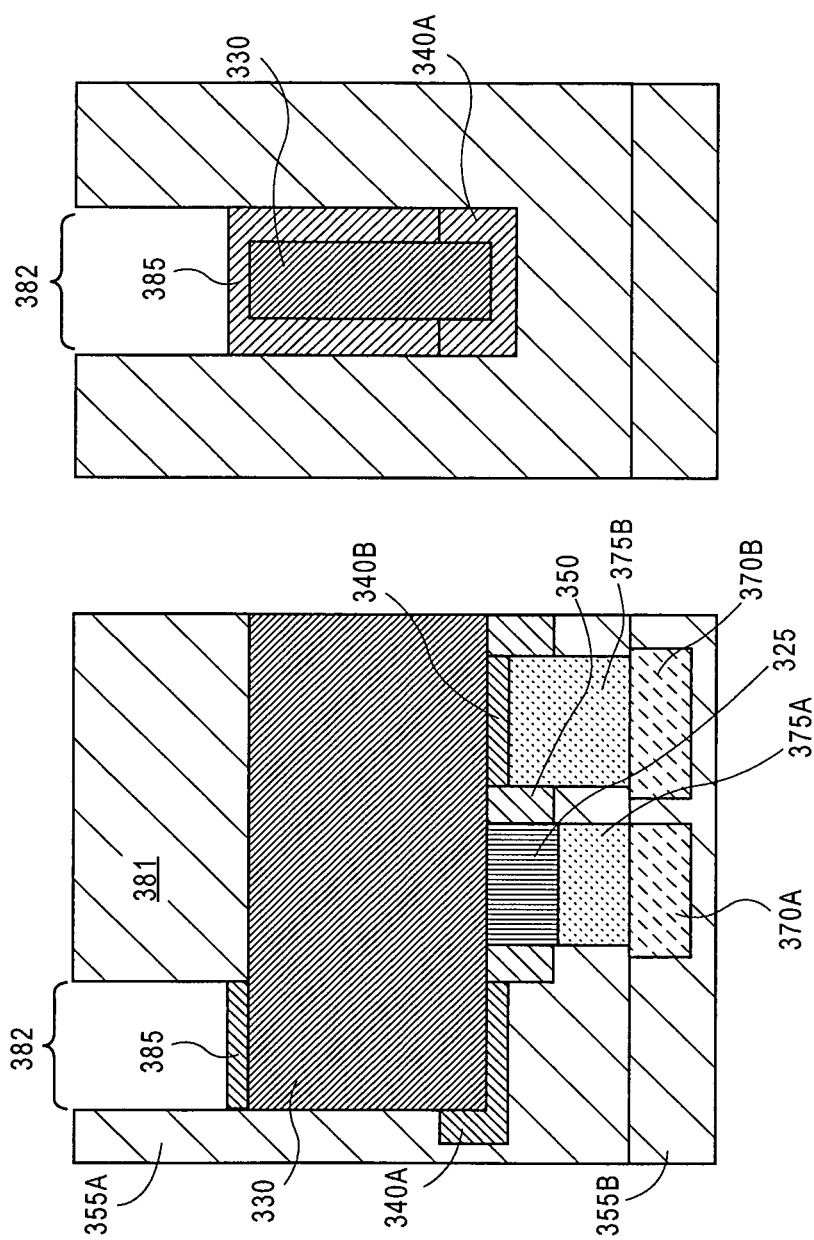
FIGS. 9A-9B show the structure of FIGS. 8A-8B following an epitaxial growth of a material for a backside junction formation.

FIG. 9A and FIG. 9B show the structure of FIG. 8A and FIG. 8B, respectively, following an epitaxial growth of a material for a backside junction formation. An example of a material is a semiconductor material such as silicon germanium or a group III-V or group IV-V semiconductor material. FIG. 8A shows epitaxially grown material 385 in opening 382 in a region aligned with a backside of source 340A. FIG. 9B shows material 385 epitaxially grown on the side walls of fin 330 and connecting with source 340 previously formed on a first side or device side of the structure.

Figures 10A, 10B:
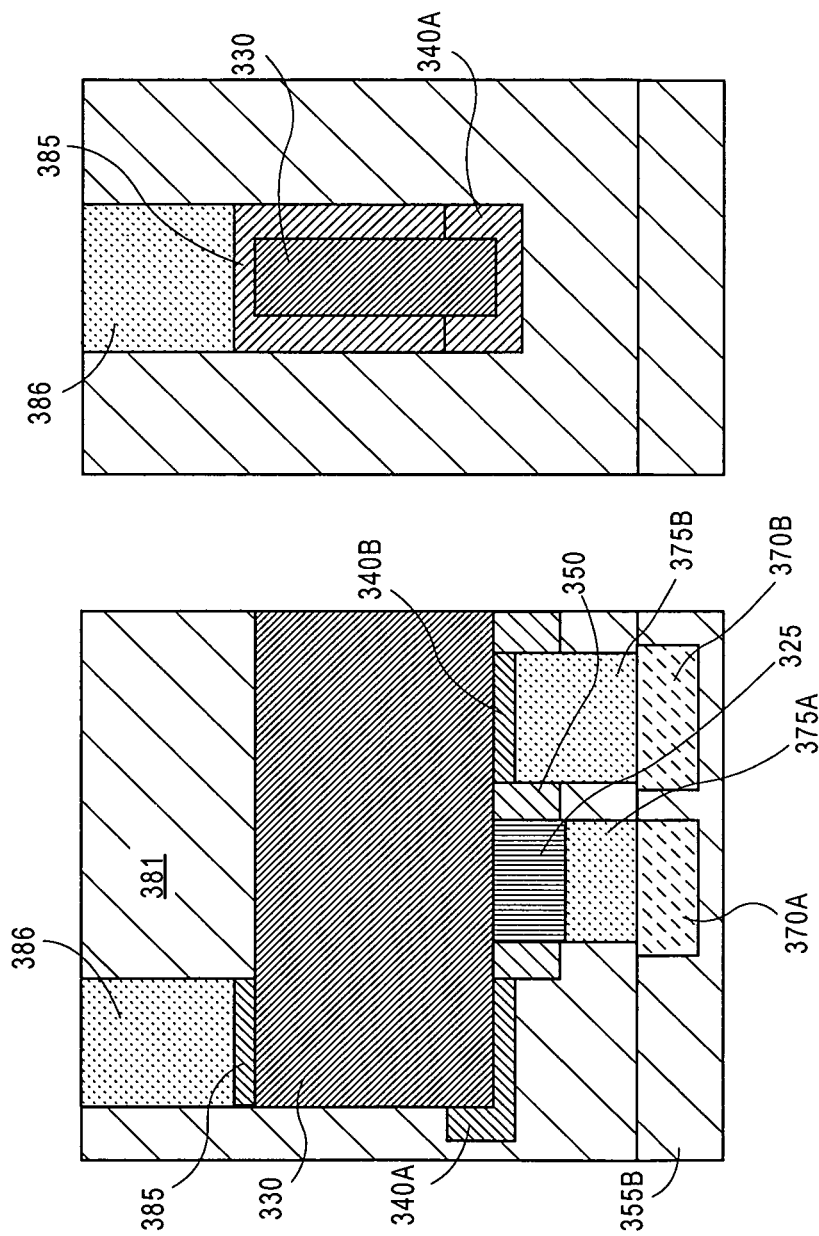
FIGS. 10A-10B show the structure of FIGS. 9A-9B following the filling of the via openings in the dielectric material with a conductive contact material such as a tungsten.

FIG. 10A and FIG. 10B show the structure of FIGS. 9A and 9B, respectively, following the filling of the via opening in dielectric material 381 with a conductive contact material such as a tungsten. FIG. 10A shows contact 386 to epitaxial material 385 associated with source 340. FIG. 10B shows contact metal 386 to epitaxial material 385. FIGS. 10A and 10B also show the connection to source 340A (via contact material) from a backside or second side of the structure an underside of the device stratum. An interconnect may now be formed to contact 386 by, for example, the technique described above with respect to device side interconnects (see FIG. 3 and the accompanying text).

The above description of forming a backside junction (source) contact is one embodiment. It is appreciated that there are other methods rather than an epitaxial growth of a material on the fin. Other embodiments include, but are not limited to, modifying regions of the fin from the backside by, for example, driving in dopants. In another embodiment, the sidewalls of fin 330 may be exposed in source region and a contact material such as tungsten may be introduced on such sidewalls. Where contact material is also formed on a device side of the source (e.g., forming such contact at the time of forming contact 375A to gate electrode 325 and contact 375B to drain 340B), the contact may be extended in a backside processing operation to form a wrap-around contact to the source. Finally, the description of forming a backside source contact not limited to only a source contact similar techniques may be used to form backside drain contact where desired.

Figures 11A, 11B:
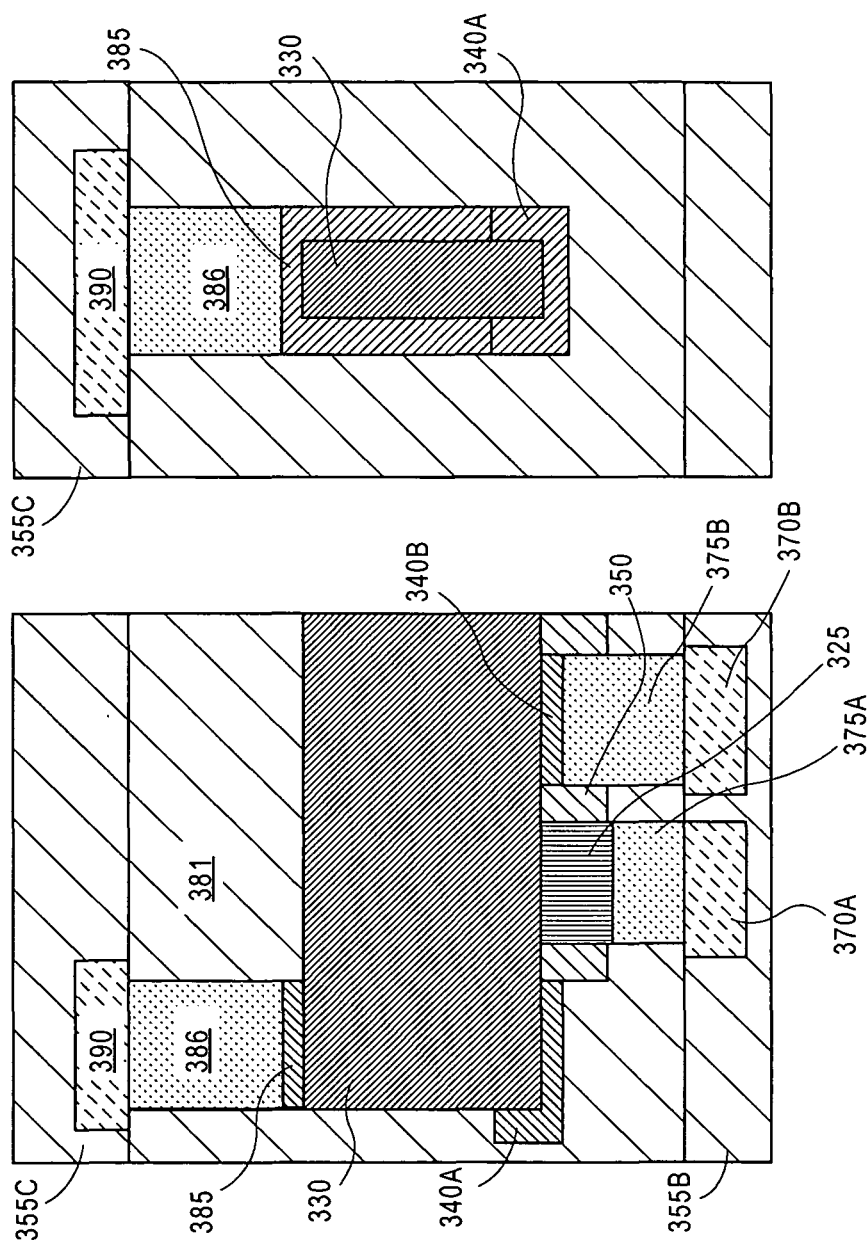
FIGS. 11A-11B shows the structure of FIGS. 10A-10B and show an interconnect connected to a contact to a source as part of, for example, a first backside interconnect or metal layer.

FIG. 11A and FIG. 11B show the structure of FIG. 10A and FIG. 10B, respectively and show interconnect 390 connected to contact 386 to source 340 as part of, for example, a first backside interconnect or metal layer. FIGS. 11A-11B also show the structure following the deposition of dielectric material 355C of silicon dioxide or a low k dielectric material on the interconnect or metal layer.

Figure 12:
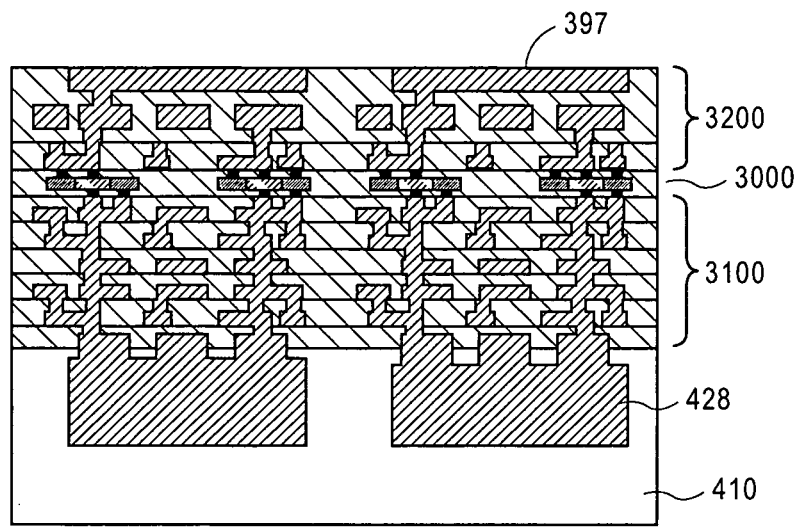
FIG. 12 shows the structure of FIG. 6 following the forming of multiple interconnect layers and contact points for connection of the structure to an external source on a second die or backside of the device stratum.

Having described the formation of a second side or backside contact to a device of device stratum 3000 and a connection of the contact to a first backside interconnect or metal layer or level, FIG. 12 shows the structure of FIG. 6 following the forming of multiple interconnect layers and contact points for connection of the structure to an external source on a second side or backside of device stratum 3000. The interconnects of such layers may be formed by an electroplating process. In one embodiment, such interconnects of a conductive material such as copper may be doped with a dopant to improve electromigration. As illustrated, each of the interconnect levels is separated from an adjoining level by dielectric material. Contact points 397 are, for example, contact pods or C4 bumps operable to connect the structure to a substrate such as a package substrate.

Figure 13:
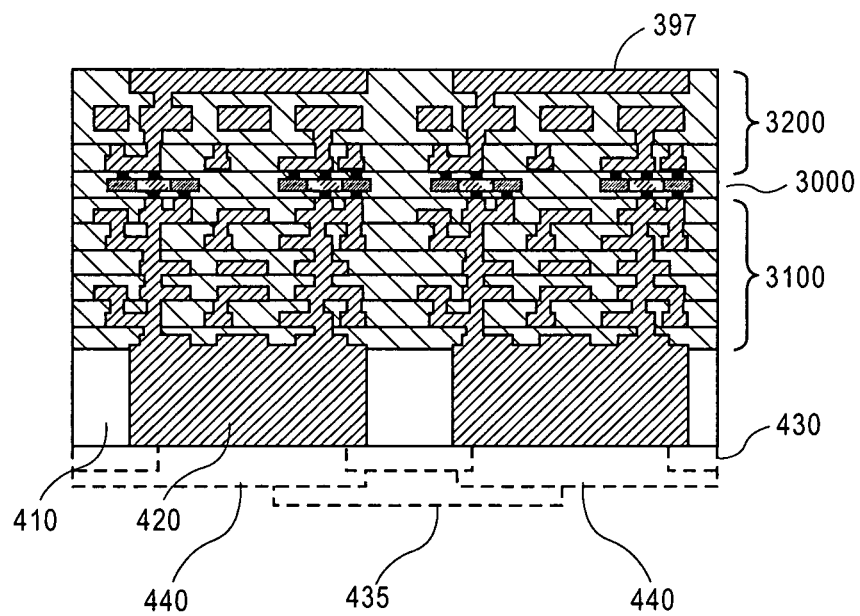
FIG. 13 shows the structure of FIG. 12 following a thinning of the carrier substrate to expose through silicon vias.

FIG. 13 shows the structure of FIG. 12 following a thinning of substrate 410. In one embodiment, substrate 410 is thinned by a mechanical grinding or etching process to expose TSVs 420 on a backside of substrate 410 so that such TSVs are available for electricaly connection to another device or substrate. The result is a structure similar to FIG. 1 described above. In another embodiment, once TSVs 420 are exposed, a redistribution layer is introduced to redistribute a connection point to TSVs 420 on a backside of substrate 410. FIG. 13 shows redistribution layer 440 of, for example, electroplated copper optionally connected to TSVs 420 and disposed between dielectric layers 430 and 435 of, for example, silicon dioxide or a high k dielectric material. In another embodiment, in addition to or as an alternative to a redistribution layer, circuit devices such as diodes, capacitors and/or inductors can be formed on substrate 410 and connected, where desired, through TSVs 420 to interconnects 3100.

Figure 14:
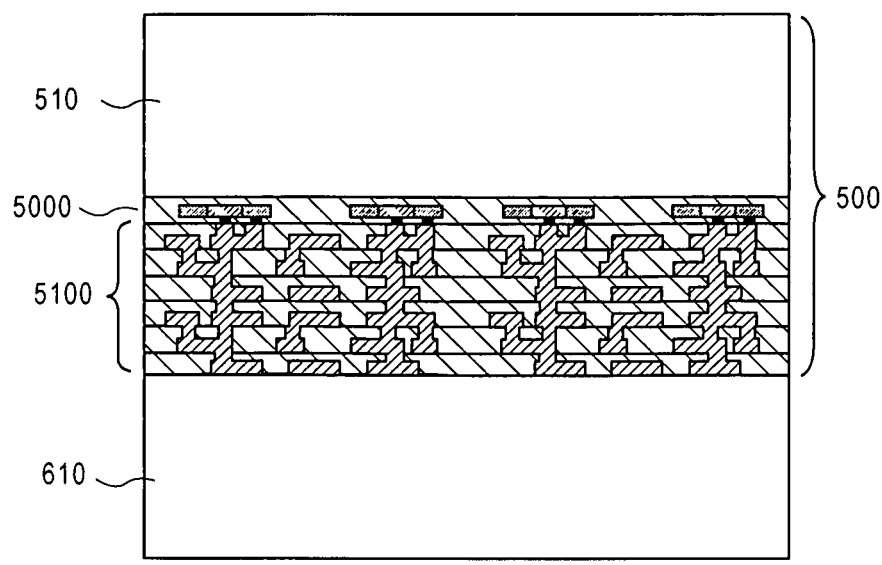
FIG. 14 shows a device substrate including a device stratum including multiple devices bonded to a carrier substrate device side down according to a second embodiment of forming an assembly.

FIGS. 14-18 describe another embodiment of a method of forming a die similar to die 110 in FIG. 1. Referring to FIG. 14, the figure shows a device wafer bonded to a carrier substrate device side down. FIG. 14 shows device structure 500 including semiconductor substrate 510, device stratum 5000 and interconnects 5100 on a first side or device side of the device stratum. Interconnects 5100 includes one or more layers of metal layers with dielectric material between metal layers.

In the embodiment illustrated in FIG. 14, device structure 500 is bonded to carrier substrate 610: Carrier substrate 610 is, for example, a semiconductor (e.g., silicon) substrate such as a wafer or portion of a wafer. Carrier substrate 610 may optionally include one or more circuit devices (e.g., diodes, capacitors, inductors) on a surface connected to device structure 500. FIG. 14 shows the assembly of device structure 500 and carrier substrate following bonding with, for example, an adhesive between the dielectric material on a surface of structure interconnects 5100 and the semiconductor material of substrate 610. In an embodiment, where one or more circuit devices are present on carrier substrate 610, such circuit devices may be connected to contact points of device structure 5100 that are connected to interconnects 5100.

Figure 15:
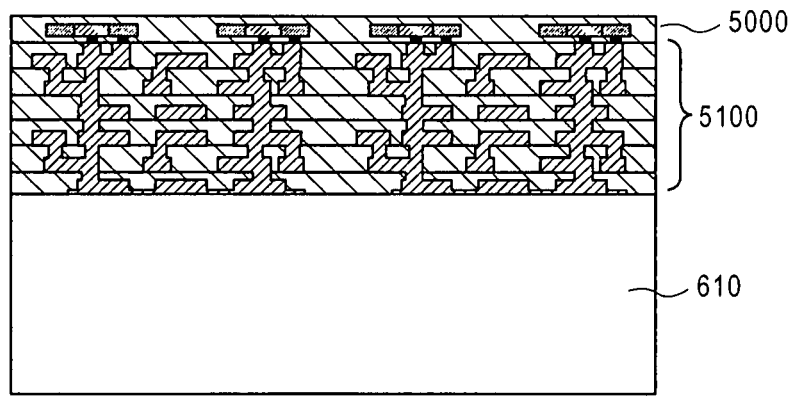
FIG. 15 shows the structure of FIG. 14 following the removal or thinning of the device substrate to expose a second side or backside of a device stratum.

FIG. 15 shows the structure of FIG. 14 following the removal or thinning of substrate 510 to expose a second side or backside of device stratum 5000 (e.g., to expose a backside or underside of fin of transistor devices of device stratum 5000). In one embodiment, substrate 510 may be removed by a thinning process, such as a mechanical grinding or etch process. In this embodiment, substrate 510 is completely removed to expose a second side or backside of device stratum 5000. The thinning of substrate 510 from a second side or backside of the structure may optionally recess or thin a portion of fins of the transistor devices of device stratum 5000 (see FIG. 3).

Figure 16:
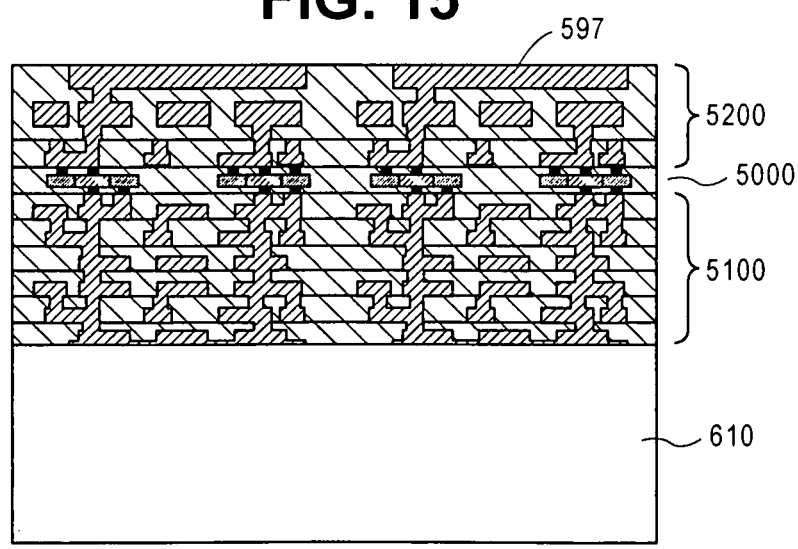
FIG. 16 shows the structure of FIG. 15 following the forming of multiple interconnect layers and contact points for connection of the structure to an external source on a second side or backside of the device stratum.

FIG. 16 shows the structure of FIG. 15 following the forming of multiple interconnect layers and contact points for connection of the structure to an external source on a second side or backside of device stratum 5000. Interconnects 5200 include contacts formed to one or more devices of device stratum 5000 by, for example, the techniques described above with reference to FIGS. 7A-10B. Interconnects 5200 also include metal layers or lines of, for example, copper formed by an electroplating process as described above (e.g., with reference to FIGS. 11A-11B). In one embodiment, such metal layers or lines of a conductive material such as copper may be doped with a dopant to improve electromigration. As illustrated, each of the metal levels is separated from an adjoining level by dielectric material. Contact points 597 are, for example, C4 bumps operable to connect the structure to a substrate such as a package substrate.

Figure 17:
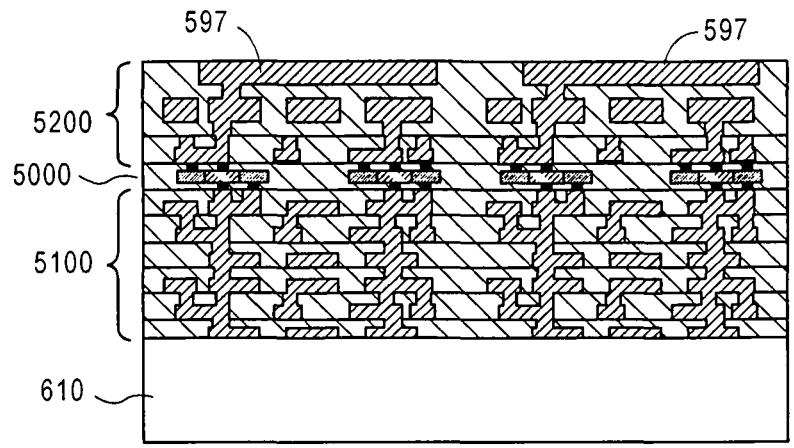
FIG. 17 shows the structure of FIG. 16 following a thinning of the carrier substrate.
Figure 18:
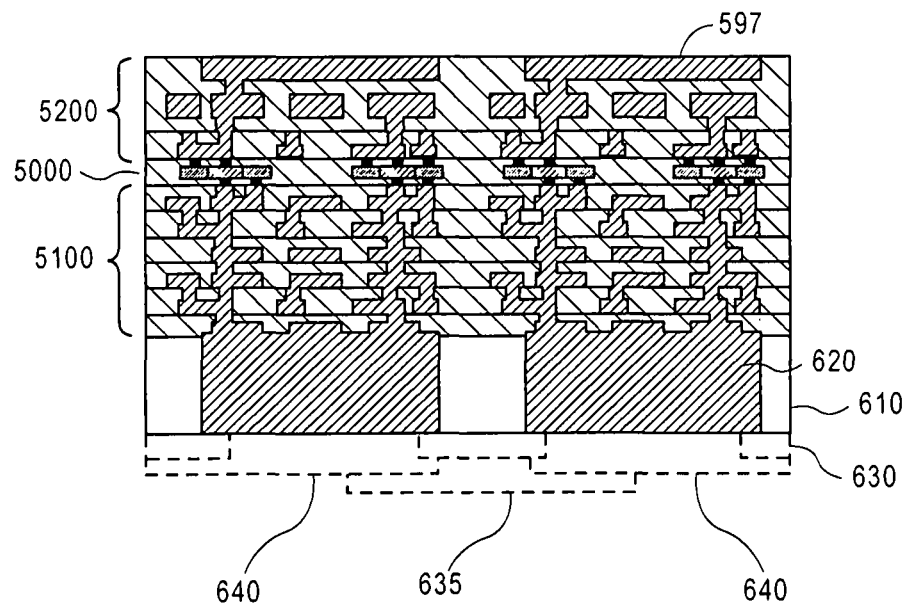
FIG. 18 shows the structure of FIG. 17 following the formation of TSVs through the carrier substrate to contact points of the interconnects on a first side of the device stratum.

FIG. 17 shows the structure of FIG. 16 following a thinning of substrate 610. In one embodiment, substrate 610 is thinned by a mechanical grinding or etching process to a desired thickness. FIG. 18 shows the structure of FIG. 17 following the formation of TSVs through substrate 610 to contact points of interconnects 5100. Representatively, TSVs 620 may be formed by masking a backside of substrate 610 (bottom side as viewed) with openings in the mask around areas of the substrate for the desired TSVs. Substrate 610 is then etched through the substrate to contact points of interconnects 5100. This is followed by a deposition of a conductive material (e.g., electroplated copper) to form TSVs 620 through substrate 610. The result is a structure similar to FIG. 1 described above. In another embodiment, once TSVs 620 are formed, a redistribution layer is introduced to redistribute a connection point to TSVs 620 on a backside of substrate 610. FIG. 18 shows optional redistribution layer 640 of, for example, electroplated copper optionally connected to TSVs 620 and disposed between dielectric layers 630 and 635 of, for example, silicon dioxide or a high k dielectric material. In another embodiment, in addition to or as an alternative to a redistribution layer, circuit devices such as diodes, capacitors and/or inductors can be formed on substrate 610 and connected, where desired, to interconnects 5100.

Figure 19:
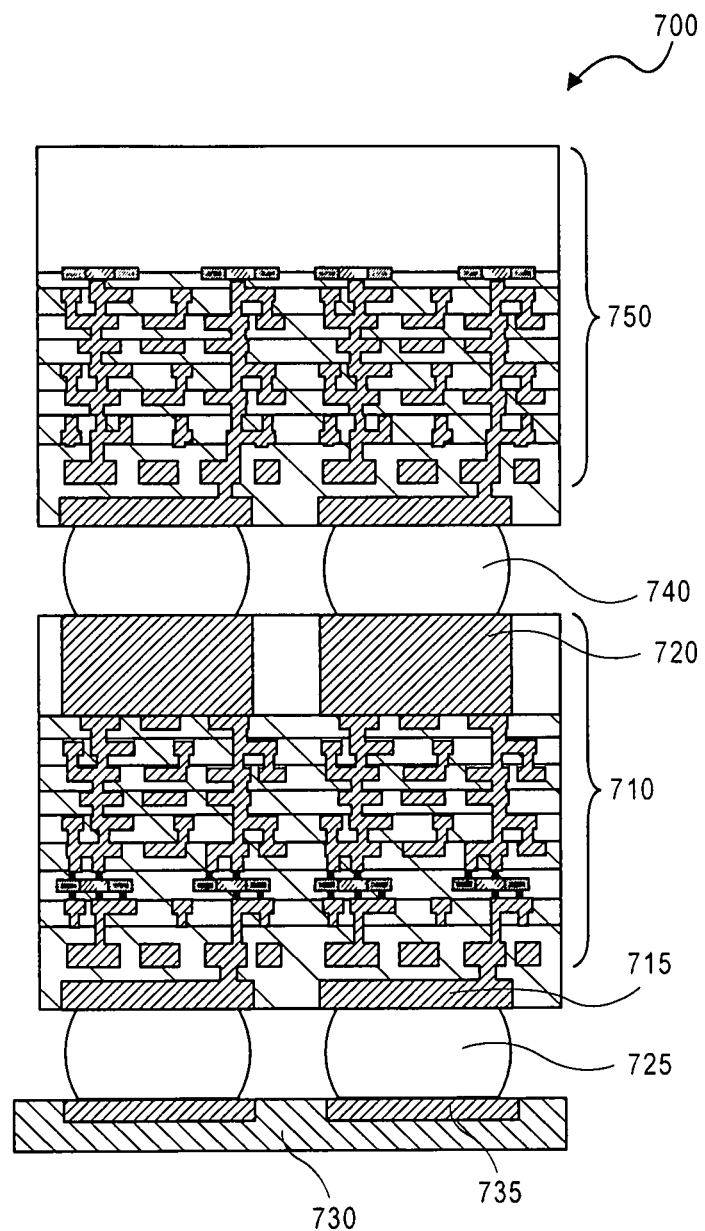
FIG. 19 shows a cross-sectional side view of an ensemble including an assembly such as described above with reference to FIG. 1 bonded to a package substrate.
Figure 20:
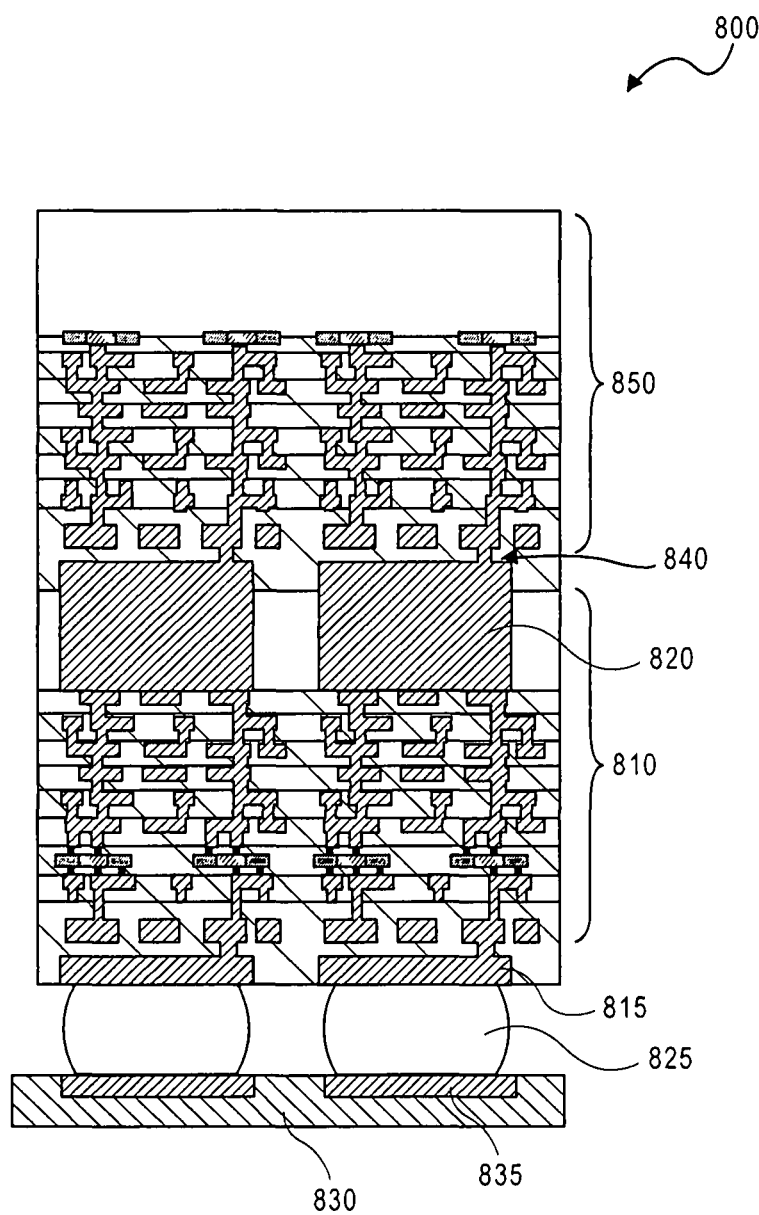
FIG. 20 shows shows a cross-sectional side view of another embodiment of an ensemble including an assembly such as described above with reference to FIG. 1 bonded to a package substrate.
Figure 21:
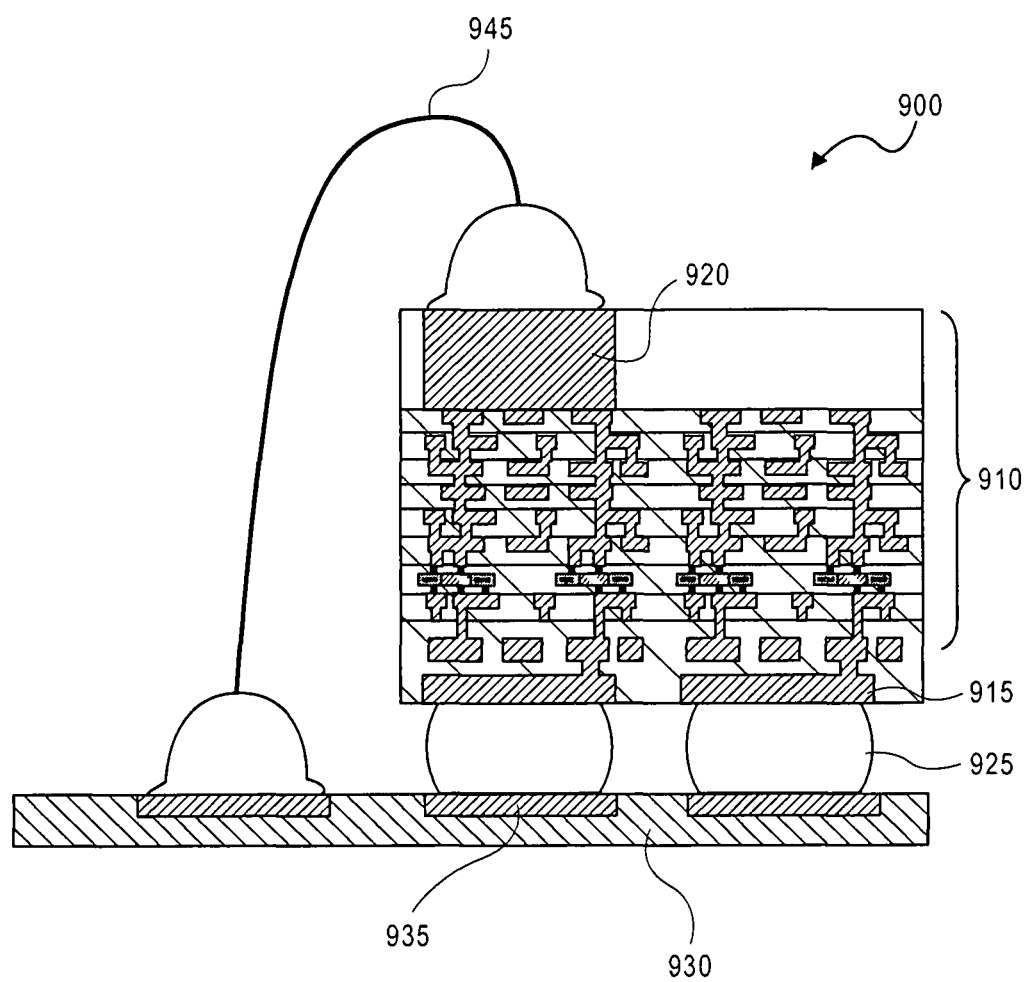
FIG. 21 shows shows a cross-sectional side view of a further embodiment of an ensemble including an assembly such as described above with reference to FIG. 1 bonded to a package substrate.

The TSVs formed in a carrier substrate as described above with reference to FIGS. 1-18 do not consume any device semiconductor layer instead landing directly on interconnects 3100 (see FIG. 13) or interconnects 5100 (see FIG. 18). Additionally, since there is no lateral interaction between TSVs and devices (e.g., transistors), prior art "keep out zones" that are placed in device layers can be eliminated or minimized. Therefore, the relatively large semiconductor area otherwise occupied by TSVs and peripherals associated with a device semiconductor layer can be saved for more functional devices (e.g., transistors). Alternatively, TSV dimensions can be enlarged. In this case, TSVs themselves can be used as bonding pads since fan out may not be necessary, eliminating the need for extra redistribution layers. This allows several packaging options. FIGS. 19-21 demonstrate examples of such options.

FIG. 19 shows a cross-sectional side view of an ensemble including an assembly such as described above with reference to FIG. 1 bonded to a package substrate. Assembly 710 includes first interconnects on a first side of a device stratum including contact pads connected to contact pads 735 of package substrate 730 through solder bonds 725. Second interconnects on a second side of a device stratum of assembly 710 are connected to TSVs 720 that extend through a carrier substrate. TSVs 720 are connected through solder bonds 740 to contact points of die 750 that is, for example, a processor, memory device, radio device, sensor device, power management device, in a die stacking arrangement.

FIG. 20 shows a cross-sectional side view of another embodiment of an ensemble including an assembly such as described above with reference to FIG. 1 bonded to a package substrate. Assembly 810 includes first interconnects on a first side of a device stratum including contact pads connected to contact pads 835 of package substrate 830 through solder bonds 825. Second interconnects on a second side of a device stratum of assembly 810 are connected to TSVs 820 that extend through a carrier substrate of the assembly. TSVs 820 are connected through direct metal to metal bonds 840 (e.g., copper to copper bonds) to contact points of die 850 that is, for example, a processor, memory device, radio device, sensor device, power management device in a die stacking arrangement.

FIG. 21 shows a cross-sectional side view of a further embodiment of an ensemble including an assembly such as described above with reference to FIG. 1 bonded to a package substrate. Assembly 910 includes first interconnects on a first side of a device stratum including contact pads connected to contact pads 935 of package substrate 930 through solder bonds 925. Second interconnects on a second side of a device stratum of assembly 910 are connected to TSVs 920 that extend through a carrier substrate of the assembly. TSVs 920 are connected through wire bonds 945 to others of contact pads 935 of the package substrate to, for example, provide additional input/output ports.

Figure 22:
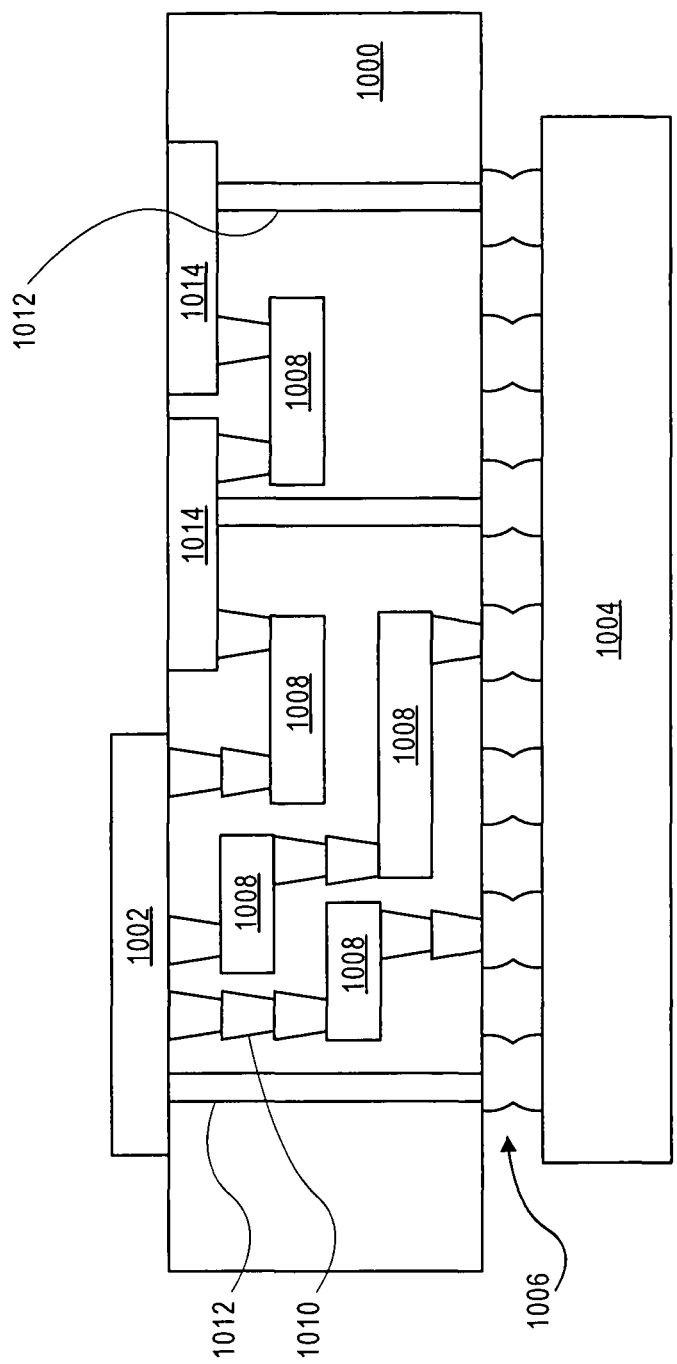
FIG. 22 is an interposer implementing one or more embodiments.

FIG. 22 illustrates interposer 1000 that includes one or more embodiments. Interposer 1000 is an intervening substrate used to bridge a first substrate 1002 to second substrate 1004. First substrate 1002 may be, for instance, an integrated circuit die. Second substrate 1004 may be, for instance, a memory module, a computer motherboard, or another integrated circuit die. Generally, the purpose of interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of interposer 1000. In other embodiments, the first and second substrates 1002/1004 are attached to the same side of interposer 1000. In further embodiments, three or more substrates are interconnected by way of interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 1000.

In accordance with embodiments, apparatuses or processes disclosed herein may be used in the fabrication of interposer 1000.

Figure 23:
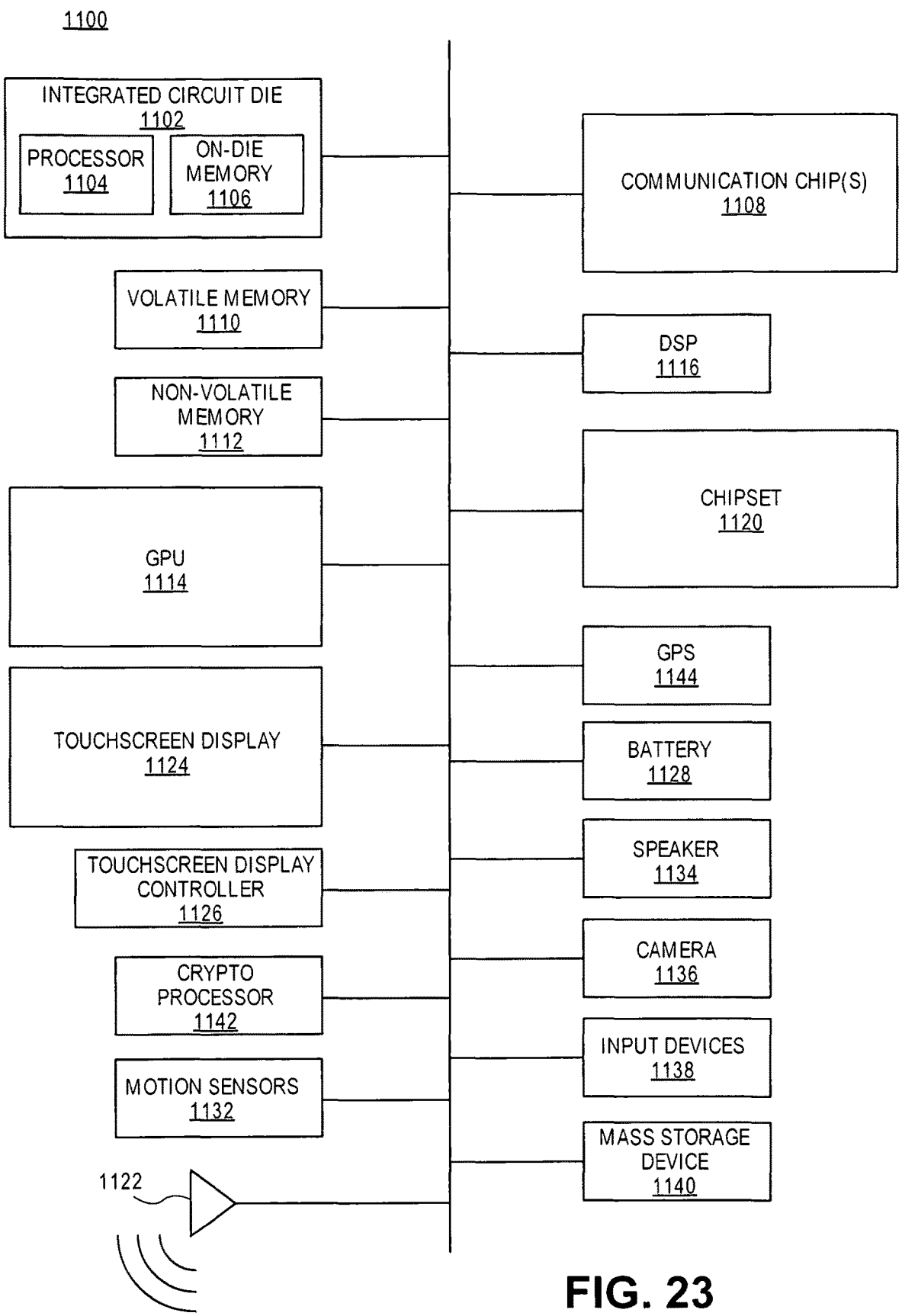
FIG. 23 illustrates an embodiment of a computing device.

FIG. 23 illustrates a computing device 1100 in accordance with one embodiment. The computing device 1100 may include a number of components. In one embodiment, these components are attached to one or more motherboards. In an alternate embodiment, these components are fabricated onto a single system-on-a-chip (SoC) die rather than a motherboard. The components in the computing device 1100 include, but are not limited to, an integrated circuit die 1102 and at least one communication chip 1108. In some implementations the communication chip 1108 is fabricated as part of the integrated circuit die 1102. The integrated circuit die 1102 may include a CPU 1104 as well as on-die memory 1106, often used as cache memory, that can be provided by technologies such as embedded DRAM (eDRAM) or spin-transfer torque memory (STTM or STTM-RAM).

Computing device 1100 may include other components that may or may not be physically and electrically coupled to the motherboard or fabricated within an SoC die. These other components include, but are not limited to, volatile memory 1110 (e.g., DRAM), non-volatile memory 1112 (e.g., ROM or flash memory), a graphics processing unit 1114 (GPU), a digital signal processor 1116, a crypto processor 1142 (a specialized processor that executes cryptographic algorithms within hardware), a chipset 1120, an antenna 1122, a display or a touchscreen display 1124, a touchscreen controller 1126, a battery 1128 or other power source, a power amplifier (not shown), a global positioning system (GPS) device 1144, a compass 1130, a motion coprocessor or sensors 1132 (that may include an accelerometer, a gyroscope, and a compass), a speaker 1134, a camera 1136, user input devices 1138 (such as a keyboard, mouse, stylus, and touchpad), and a mass storage device 1140 (such as hard disk drive, compact disk (CD), digital versatile disk (DVD), and so forth). The communications chip 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1108. For instance, a first communication chip 1108 may be dedicated to shorter range wireless communications such as Wi-Fi and Bluetooth and a second communication chip 1108 may be dedicated to longer range wireless communications such as GPS, EDGE, GPRS, CDMA, WiMAX, LTE, Ev-DO, and others.

The processor 1104 of the computing device 1100 includes one or more devices, such as transistors or metal interconnects, that are formed in accordance with embodiments including backside contacts to device and backside metallization and a carrier substrate including TSV to connected to device side or backside metallization. The term "processor" may refer to any device or portion of a device that processes electronic data from registers and/or memory to transform that electronic data into other electronic data that may be stored in registers and/or memory.

The communication chip 1108 may also include one or more devices, such as transistors or metal interconnects, that are formed in accordance with embodiments including backside contacts to device and backside metallization and a carrier substrate including TSV to connected to device side or backside metallization.

In further embodiments, another component housed within the computing device 1100 may contain one or more devices, such as transistors or metal interconnects, that are formed in accordance with implementations including backside contacts to device and backside metallization and a carrier substrate including TSV to connected to device side or backside metallization.

In various embodiments, the computing device 1100 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

EXAMPLES

Example 1 is an apparatus including a circuit structure including a device stratum including a plurality of transistor devices each including a first side and an opposite second side; one or more electrically conductive interconnect levels on a first side of the device stratum and coupled to ones of the transistor devices; and a substrate including an electrically conductive through silicon via coupled to the one or more electrically conductive interconnect levels on a first side of the structure so that the one or more interconnect levels are between the through silicon via and the device stratum.

In Example 2, the one or more electrically conductive interconnect levels of the apparatus of Example 1 include one or more first interconnect levels, the apparatus further including one or more second interconnect levels on a second side of the device stratum coupled to ones of the transistor devices.

In Example 3, the apparatus of Example 2 further includes contact points disposed on the second side of the device stratum operable to be coupled to an external source and coupled to the at least second interconnect layer.

In Example 4, the through silicon via of the apparatus of any of Examples 1-3 includes a first side coupled to the one or more electrically conductive interconnect level and a second side operable to be coupled to an external source.

In Example 5, the second side of the through silicon via of the apparatus of Example 4 defines a contact pad.

In Example 6, the apparatus of Example 4 further includes contact pads disposed on the second side of the through silicon via operable to be coupled to an external source and coupled to the through silicon via.

Example 7 is a system including a package substrate including a supply connection; and a die coupled to the package substrate, the die including: (i) a device stratum including a plurality of transistor devices each including a first side and an opposite second side; (ii) one or more electrically conductive interconnect levels on a first side of the device stratum and coupled to ones of the transistor devices; and (iii) a substrate including a an electrically conductive through silicon via coupled to the one or more electrically conductive interconnect level on a first side of the structure so that the one or more interconnect levels are between the through silicon via and the device stratum.

In Example 8, the one or more electrically conductive interconnect levels of the system of Example 7 include one or more first interconnect levels, the apparatus further including one or more second interconnect levels on a second side of the device stratum coupled to ones of the transistor devices.

In Example 9, the system of Example 8 further includes contact points disposed on the second side of the device stratum operable to be coupled to an external source and coupled to the at least second interconnect layer.

In Example 10, the through silicon via of the system of any of Examples 7-9 includes a first side coupled to the one or more electrically conductive interconnect level and a second side operable to be coupled to an external source.

In Example 11, the second side of the through silicon via of the system of Example 10 defines a contact pad.

In Example 12, the system of Example 10 further includes contact pads disposed on the second side of the through silicon via operable to be coupled to an external source and coupled to the through silicon via.

Example 13 is a method including forming a plurality of transistor devices on a substrate, the plurality of transistor devices defining a device stratum including a first side and an opposite second side, wherein the second side is coupled to the substrate; forming one or more interconnect levels on a first side of the device stratum, the one or more interconnect levels coupled to ones of the plurality of devices; removing a portion of the substrate; and coupling a through silicon via to the one or more interconnect levels such that the one or more interconnect levels is disposed between the device stratum and the through silicon via.

In Example 14, the through silicon via of the method of Example 13 is disposed through a substrate and coupling the through silicon via to the one or more interconnect level includes coupling the substrate including the through silicon via.

In Example 15, prior to coupling the through silicon via to the one or more interconnect levels, the method of any of Examples 13-14 includes coupling a substrate to the one or more interconnect levels and coupling the through silicon via includes forming the through silicon via through the substrate.

In Example 16, removing a portion of the substrate of the method of any of Examples 13-15 includes removing the entire portion of the substrate.

In Example 17, the one or more interconnect levels of the method of any of Examples 13-16 includes a one or more first interconnect levels, the method further including forming at least one or more second interconnect levels on the second side of the device stratum wherein the one or more second interconnect levels are coupled to ones of the plurality of transistor devices.

In Example 18, the method of Example 17 further includes forming contact points on the second side of the device stratum operable to be coupled to an external source and coupled to the one or more second interconnect levels.

In Example 19, the through silicon vias of the method of any of Examples 13-18 include a first side coupled to the one or more interconnect level and a second side, wherein the second side of the through silicon via defines a contact pad operable to be coupled to an external source.

In Example 20, the method of any of Examples 13-19 further includes forming contact pads on the second side of the through silicon via operable to be coupled to an external source and coupled to the through silicon via.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a circuit structure comprising a device stratum comprising a plurality of transistor devices each comprising a first side and an opposite second side, wherein each of the plurality of transistor devices comprises a gate, a source, and a drain;
one or more electrically conductive interconnect levels on a first side of the device stratum and coupled directly to the gate of one of the plurality of transistor devices at the first side of the one of the plurality of transistor devices;
one or more second interconnect levels on a second side of the device stratum and coupled directly to the gate of the one of the plurality of transistor devices at the second side of the one of the plurality of transistor devices; and
a silicon substrate comprising an electrically conductive through silicon via coupled to the one or more electrically conductive interconnect levels on the first side of the device stratum so that the one or more interconnect levels are between the through silicon via and the device stratum.

2. The apparatus of claim 1, wherein the through silicon via comprises a first side coupled to the one or more electrically conductive interconnect level and a second side operable to be coupled to an external source.

3. The apparatus of claim 2, wherein the second side of the through silicon via defines a contact pad.

4. The apparatus of claim 2, further comprising contact pads disposed on the second side of the through silicon via operable to be coupled to an external source and coupled to the through silicon via.

5. The apparatus of claim 1, wherein the one or more electrically conductive interconnect levels comprise one or more first interconnect levels.

6. The apparatus of claim 1, further comprising contact points disposed on the second side of the device stratum operable to be coupled to an external source and coupled to the at least second interconnect layer.

7. A system comprising:
a package substrate comprising a supply connection; and
a die coupled to the package substrate, the die comprising:
(i) a device stratum comprising a plurality of transistor devices each comprising a first side and an opposite second side, wherein each of the plurality of transistor devices comprises a gate, a source, and a drain;
(ii) one or more electrically conductive interconnect levels on a first side of the device stratum and coupled directly to the gate of one of the plurality of transistor devices at the first side of the one of the plurality of transistor devices;
(iii) one or more second interconnect levels on a second side of the device stratum and coupled directly to the gate of the one of the plurality of transistor devices at the second side of the one of the plurality of transistor devices; and
(iv) a silicon substrate comprising an electrically conductive through silicon via coupled to the one or more electrically conductive interconnect level on the first side of the device stratum so that the one or more interconnect levels are between the through silicon via and the device stratum.

8. The system of claim 7, wherein the through silicon via comprises a first side coupled to the one or more electrically conductive interconnect level and a second side operable to be coupled to an external source.

9. The system of claim 8, wherein the second side of the through silicon via defines a contact pad.

10. The system of claim 8, further comprising contact pads disposed on the second side of the through silicon via operable to be coupled to an external source and coupled to the through silicon via.

11. The system of claim 7, wherein the one or more electrically conductive interconnect levels comprise one or more first interconnect levels.

12. The system of claim 7, further comprising contact points disposed on the second side of the device stratum operable to be coupled to an external source and coupled to the at least second interconnect layer.

13. A method comprising:
forming a plurality of transistor devices on a substrate, the plurality of transistor devices defining a device stratum comprising a first side and an opposite second side, wherein the second side is coupled to the substrate, wherein each of the plurality of transistor devices comprises a gate, a source, and a drain;
forming one or more interconnect levels on a first side of the device stratum, the one or more interconnect levels coupled directly to the gate of one of the plurality of transistor devices at a first side of the one of the plurality of transistor devices;
removing a portion of the substrate;
coupling a through silicon via to the one or more interconnect levels such that the one or more interconnect levels is disposed between the device stratum and the through silicon via, wherein the through silicon via is disposed through a silicon substrate; and
forming one or more second interconnect levels on a second side of the device stratum and coupled directly to the gate of the one of the plurality of transistor devices at a second side of the one of the plurality of transistor devices, the second side opposite the first side.

14. The method of claim 13, wherein coupling the through silicon via to the one or more interconnect level comprises coupling the silicon substrate comprising the through silicon via.

15. The method of claim 13, wherein prior to coupling the through silicon via to the one or more interconnect levels, the method comprises coupling the silicon substrate to the one or more interconnect levels and coupling the through silicon via comprises forming the through silicon via through the silicon substrate.

16. The method of claim 13, wherein removing a portion of the substrate comprises removing the entire portion of the substrate.

17. The method of claim 13, wherein the one or more interconnect levels comprises a one or more first interconnect levels.

18. The method of claim 13, further comprising forming contact points on the second side of the device stratum operable to be coupled to an external source and coupled to the one or more second interconnect levels.

19. The method of claim 13, wherein the through silicon vias comprise a first side coupled to the one or more interconnect level and a second side, wherein the second side of the through silicon via defines a contact pad operable to be coupled to an external source.

20. The method of claim 13, further comprising forming contact pads on the second side of the through silicon via operable to be coupled to an external source and coupled to the through silicon via.

* * * * *